United States Patent [19]

Matsumoto et al.

[11] Patent Number: 5,625,308

[45] Date of Patent: Apr. 29, 1997

[54] TWO INPUT-TWO OUTPUT DIFFERENTIAL LATCH CIRCUIT

[75] Inventors: Osamu Matsumoto; Takahiro Miki; Toshio Kumamoto, all of Hyogo, Japan

[73] Assignee: Mitsubishi Denki Kabushiki Kaisha, Tokyo, Japan

[21] Appl. No.: 557,556

[22] Filed: Nov. 14, 1995

[30] Foreign Application Priority Data

Jun. 8, 1995 [JP] Japan ..................... 7-141788

[51] Int. Cl.$^6$ ............. H03K 3/289; H03K 3/356
[52] U.S. Cl. ............. 327/203; 327/52; 327/57; 327/208
[58] Field of Search ..................... 327/52, 54, 55, 327/56, 57, 199, 201, 203, 208, 210, 211, 212, 213, 215, 562, 563, 63–65

[56] References Cited

U.S. PATENT DOCUMENTS

| | | | |
|---|---|---|---|
| 4,147,943 | 4/1979 | Peterson | 327/52 |
| 4,461,964 | 7/1984 | Shiotari | 327/208 |
| 4,792,923 | 12/1988 | Nakase et al. | 327/199 |
| 5,034,636 | 7/1991 | Reis et al. | 327/52 |
| 5,148,061 | 9/1992 | Hsueh et al. | 327/211 |
| 5,214,317 | 5/1993 | Nguyen | 327/203 |
| 5,216,295 | 6/1993 | Hoang | 327/203 |
| 5,384,504 | 1/1995 | Kickinson et al. | 327/57 |
| 5,408,138 | 4/1995 | Khosravi et al. | 327/203 |
| 5,426,384 | 6/1995 | May | 327/57 |
| 5,510,734 | 4/1996 | Sone | 327/203 |

FOREIGN PATENT DOCUMENTS

| | | |
|---|---|---|
| 59-79486 | 5/1984 | Japan . |
| 59-972220 | 6/1984 | Japan . |
| 59-148425 | 8/1984 | Japan . |

OTHER PUBLICATIONS

Japan Society of Electronic Information Communication, vol. J74–C–II, No. 2, pp. 81–91, Feb. 1991, Yasuhiro Sugimoto, et al., "A 40 Msps 10–Bit Video BiCMOS Analog to Digital Converter".

Mos Camparators, pp. 425–437, Roubik Gregorian, et al., "Analog MOS Integrated Circuits for Signal Processing".

Primary Examiner—Timothy P. Callahan
Assistant Examiner—My-Trang Nu Ton
Attorney, Agent, or Firm—Oblon, Spivak, McClelland, Maier & Neustadt, P.C.

[57] ABSTRACT

A high-performance differential latch circuit which includes a differential amplifier circuit comprised of an NMOS transistor (27) serving as a constant current source, PMOS transistors (3, 4) and NMOS transistors (23,24), a latch circuit comprised of NMOS transistors (25, 26), and a switch circuit comprised of NMOS transistors (21,22,28) for alternately operating the differential amplifying function and latch function, the transistor (27) serving as the constant current source having a drain terminal directly connected to the transistors (23,24) and a source terminal directly connected to a ground voltage (2), whereby the differential latch circuit differentially amplifies the signals without the loss of the constant current source function during the differential amplification.

14 Claims, 8 Drawing Sheets

5,625,308

TWO INPUT-TWO OUTPUT DIFFERENTIAL LATCH CIRCUIT

BACKGROUND OF THE INVENTION

1. Field of the Invention

The present invention relates to a two-input two-output differential latch circuit for use in analog-to-digital converters and the like.

2. Description of the Background Art

Conventionally, analog-to-digital converters (referred to hereinafter as A-D converters) contain a voltage comparator for comparing two signal voltages to output a logic signal "H" or "L". FIG. 10 is a circuit diagram of a conventional differential latch circuit in a voltage comparator which is disclosed in "Analog MOS Integrated Circuit FOR SIGNAL PROCESSING", p. 434, FIG. 6.25.

In FIG. 10, the reference numeral 1 designates a power supply voltage (referred to hereinafter as Vdd); 2 designates a ground voltage (referred to hereinafter as Vss; specifically 0 V); 3 and 4 designate p-channel MOS transistors (referred to hereinafter as PMOS transistors) each having a source terminal connected to the Vdd 1 and functioning as an active load resistor; and 5 through 11 designate n-channel MOS transistors (referred to hereinafter as NMOS transistors). The reference character a and b designate input terminals receiving input signals; c and d designate output terminals for providing logic signals; and A and B designate nodes connected to the output terminals c and d, respectively.

At the node A, the drain terminals of the PMOS transistor 3 and NMOS transistors 5, 7, and the gate electrode of the NMOS transistor 8 are connected together. At the node B, the drain terminals of the PMOS transistor 4 and NMOS transistors 6, 8, and the gate electrode of the NMOS transistor 7 are connected together. The source terminals of the NMOS transistors 5, 6 are commonly connected to the drain terminal of the NMOS transistor 9, and the source terminals of the NMOS transistors 7, 8 are commonly connected to the drain terminal of the NMOS transistor 10. The reference character C designates a node connecting the NMOS transistors 5, 6 and 9, and D designates a node connecting the NMOS transistors 7, 8 and 10. The NMOS transistor 11 has a source terminal connected to the Vss 9 and a drain terminal connected to the source terminals of the NMOS transistors 9, 10. The reference character E designates a node connecting the NMOS transistors 9, 10 and 11.

The input terminals a and b are connected to the gate electrodes of the NMOS transistors 5 and 6, respectively.

The reference characters Vin1 and Vin2 designate the potentials of the input signals applied to the input terminals a and b, respectively; Vout1 and Vout2 designate the potentials of the output signals outputted from the output terminal c and d, respectively; Bias1 designates a bias voltage applied to the gate electrode of the NMOS transistor 11 to operate the NMOS transistor 11 as a constant current source in a saturation region; Bias2 designates a bias voltage commonly applied to the gate electrodes of the PMOS transistors 3, 4 to operate the PMOS transistors 3, 4 as active load resistors in the saturation region.

The reference characters X and $\overline{X}$ designate complementary digital signals applied to the gate electrodes of the NMOS transistors 9 and 10, respectively, for controlling the switching between a through mode and a latch mode of the differential latch circuit. The NMOS transistors 9, 10 serve as switches, and the H level of the signals X and $\overline{X}$ is set to a potential which operates the NMOS transistors 9, 10 when conducting in a linear region.

The operation of the differential latch circuit will be described below.

The differential latch circuit is in the through mode when X=H and $\overline{X}$=L, and is in the latch mode when X=L and $\overline{X}$=H. The two modes are alternately repeated at predetermined time intervals.

(1) X=H and $\overline{X}$=L (through mode)

The NMOS transistor 9 is ON and the NMOS transistor 10 is OFF. The entire current produced by the NMOS transistor 11 passes through the NMOS transistor 9. Thus the NMOS transistors 5, 6, 11 and PMOS transistors 3, 4 form a conventional differential amplifier circuit which outputs the output potentials Vout1 and Vout2 having a potential difference based on the potential difference between the input potentials Vin1 and Vin2.

(2) X=L and $\overline{X}$=H (latch mode)

Conversely, the NMOS transistor 9 is OFF and the NMOS transistor 10 is ON. The entire current produced by the NMOS transistor 11 passes through the NMOS transistor 10, and the above noted differential amplifier circuit does not function.

When Vin1>Vin2 in the through mode immediately prior to the start of the latch mode, the output potentials Vout1 and Vout2 are set so that the potential difference satisfies Vout1<Vout2. Upon switching to the latch mode, the output potential Vout1 is the gate voltage of the NMOS transistor 8 and the output potential Vout2 is the gate voltage of the NMOS transistor 7. Then the drain current of the NMOS transistor 7 is greater than the drain current of the NMOS transistor 8. This further decreases the output potential Vout1 which is the drain potential of the NMOS transistor 7 and further increases the output potential rout: which is the drain potential of the NMOS transistor 8. The interaction such that the increase in output potential Vout2 accelerates the decrease in output potential Vout1 and vice versa determines Vout1=L and Vout2=H. When Vin1<Vin2 immediately prior to the start of the latch mode, the inverted operation is performed to determine Vout1=H and Vout2=L.

FIG. 11 is a circuit diagram of a voltage comparator using the differential latch circuit of FIG. 10. The reference numerals 12 and 13 designate differential amplifiers of the same construction; and 14 designates the differential latch circuit of FIG. 10.

FIG. 12 is a circuit diagram of the differential amplifiers 12 and 13 each includes an NMOS transistor 15 serving as a constant current source, NMOS transistors 16 and 17 having source terminals connected to the drain terminal of the NMOS transistor 15, a PMOS transistor 18 having a drain terminal connected to the drain terminal of the NMOS transistor 16, and a PMOS transistor 19 having a drain terminal connected to the drain terminal of the NMOS transistor 17. Each of the differential amplifiers 12 and 13 has input terminals a and b connected respectively to the gate electrodes of the NMOS transistors 16 and 17, and output terminals c and d connected respectively to the drain terminals of the NMOS transistors 16 and 17, and amplifies a potential difference between Vin1 and Vin2 of the signals received at the input terminals a and b into a potential difference between Vout1 and Vout2 at the output terminals c and d. The reference character Bias02 designates a bias voltage applied to the gate electrodes of the PMOS transistors 18 and 19 to operate the PMOS transistors 18 and 19 as active load resistors; and Bias01 designates a bias voltage applied to the gate electrode of the NMOS transistor 15 to operate the NMOS transistor 15 as a constant current source.

Referring to FIG. 11, the output terminals c and d of the differential amplifier 12 are connected respectively to the input terminals a and b of the differential amplifier 13, and the output terminals c and d of the differential amplifier 13 are connected respectively to the input terminals a and b of the differential latch circuit 14. The bias voltages Bias01 and Bias02 are commonly applied to the differential amplifiers 12 and 13.

For example, when an analog signal voltage Vin is applied to the input terminal a of the differential amplifier 12 and a constant reference voltage Vref for comparison is applied to the input terminal b thereof, the differential amplifiers 12 and 13 amplify the voltage difference between Vin and Vref, and the differential amplifier 13 outputs two output voltages which are input voltages to the differential latch circuit 14. The differential latch circuit 14 alternately repeats the through mode and latch mode with time to further amplify the potential difference in the through mode and determine the logic signal "H" or "L" of the output signals Vout1 and Vout2 in the latch mode. In the voltage comparator circuit of FIG. 11, Vout1=H and Vout2=L in the latch mode when Vin<Vref at the end of the through mode. These output signals are applied to a CMOS digital encoder at the next stage for converting the analog signal voltages to digital signals.

FIG. 13 shows another conventional differential latch circuit corresponding to a circuit arrangement comprising transistors M5 to M10 of a previous-stage comparator disclosed in "Papers for Institute of Electronics, Information and Communication Engineers of Japan, C-II, Vol. J74-C-II, No. 2, February 1994", pp. 81–91, FIG. 4 on page 84.

In FIG. 13, the reference numerals 71 and 72 designate PMOS transistors; and 73 and 74 designate NMOS transistors. The PMOS transistor 71 and NMOS transistor 73 have drain terminals connected together and gate electrodes connected together. The reference character G I designates a connection node between the drain terminals of the PMOS transistor 71 and NMOS transistor 73, and H1 designates a connection node between the gate electrodes thereof. Similarly, the PMOS transistor 72 and NMOS transistor 74 have drain terminals connected together, and gate electrodes connected together. The reference character G2 designates a connection node between the drain terminals of the PMOS transistor 72 and NMOS transistor 74, and H2 designates a connection node between the gate electrodes thereof.

The reference numerals 75 through 78 designate switch circuits. An input terminal a is connected to the nodes G1 and H2 through the switch circuit 75, and an input terminal b is connected to the nodes H1 and G2 through the switch circuit 76. An output terminal c is connected to the nodes G1 and H2, and an output terminal d is connected to the nodes G2 and H1. The Vdd 1 is connected to the source terminals of the PMOS transistors 71 and 72 through the switch circuit 77, and the Vss 2 is connected to the source terminals of the NMOS transistors 73 and 74 through the switch circuit 78.

The reference character X designates a digital signal applied to the switch circuits 75 and 76, and $\overline{X}$ designates a digital signal applied to the switch circuits 77 and 78. The signals X and $\overline{X}$ are complementary digital signals. Each of the switch circuits 75 to 78 is ON when the applied digital signal is "H" and is OFF when it is "L". Thus, the switch circuits 77 and 78 are OFF when the switch circuits 75 and 76 are ON, and the switch circuits 75 and 76 are OFF when the switch circuits 77 and 78 are ON. Other reference numerals and characters of FIG. 13 designate parts identical with or corresponding to those of FIG. 10.

The operation of the differential latch circuit will be described with reference to the timing chart of FIG. 14. FIG. 14 shows variations in output potentials Vout1 and Vout2 versus time.

The differential latch circuit, similar to that of FIG. 10, is in the through mode when X=H and $\overline{X}$=L and is in the latch mode when X=L and $\overline{X}$=H. These two modes are alternately repeated at predetermined time intervals. It is assumed that the input signals have constant potentials Vin1 and Vin2 (Vin1>Vin2).

(1) X=H and $\overline{X}$=L (through mode)

The switch circuits 75 and 76 are ON, and the switch circuits 77 and 78 are OFF. The input terminals a and b are directly connected to the output terminals c and d, and the input signals Vin1 and Vin2 are, as they are, the output signals Vout1 and Vout2 as shown in FIG. 14. The Vdd 1 and Vss 2 are disconnected from the PMOS transistors 71, 72 and NMOS transistors 73, 74, resulting in occurrence of no latch operation.

(2) X=L and $\overline{X}$=H (latch mode)

The switch circuits 75 and 76 are OFF, and the switch circuits 77 and 78 are ON. The Vdd 1 and Vss 2 are connected to the PMOS transistors 71, 72 and NMOS transistors 73, 74. The PMOS transistor 71 and NMOS transistor 73 form an inverter, and the PMOS transistor 72 and NMOS transistor 74 form an inverter. The output from one of the inverters is the input to the other inverter. Thus the output terminals c and d are forced to "H" or "L" using the potentials Vout1 (=Vin1) and Vout2 (=Vin2) outputted in the through mode as initial voltages.

The differential latch circuit has an inherent threshold voltage which determines "H" or "L" at its output. The threshold voltage is determined by the characteristics of the two inverters. When both of the input signal potentials Vin1 and Vin2 are higher than the threshold voltage in the through mode as shown in FIG. 14, an output voltage conflict occurs after the switching to the latch mode, that is, both of the two inverters output "L", decreasing the output signal potentials Vout1 and Vout2 to about the threshold voltage. As the output signal potential Vout2 becomes lower than the threshold voltage, the output signal potential Vout1 rises to "H" (Vdd), and the output signal potential Vout2 falls to "L" (Vss).

Referring again to FIG. 11, the differential latch circuit of FIG. 13 is used as the differential latch circuit 14, and the output terminals c and d of the differential amplifier circuit 13 are connected respectively to the input terminals a and b of the differential latch circuit of FIG. 13, thereby forming a voltage comparator.

In the differential latch circuit of FIG. 10, the NMOS transistor 9 serving as a switch is connected between the source terminals of the NMOS transistors 5, 6 receiving the input signals and the drain terminal of the NMOS transistor 11 serving as a constant current source. Unfortunately, when the NMOS transistor 9 is ON (that is, in the through mode), a voltage drop in the NMOS transistor 9 decreases the voltage applied to the drain terminal of the NMOS transistor 11. The NMOS transistor 11 having a smaller drain-source potential difference operates in the linear region, which might cause a loss of constant current property of the NMOS transistor 11 which is to serve as a current source. The result is differential amplification with unsatisfactory gain in response to the two signal inputs Vin1 and Vin2.

This prevents the differential latch circuit of FIG. 10 from amplifying the applied signals amplified by the differential amplifiers 12 and 13 as shown in FIG. 11 up to a predetermined value in the through mode. The differential latch circuit might fail to perform correct and rapid latch operation upon switching to the latch mode.

When the differential latch circuit makes a transition from the through mode to the latch mode, one of the output signal potentials Vout1 and Vout2 exhibits "L". For example, when the output signal potential Vout1 is "L", electrons are extracted from the node A receiving the output signal potential Vout1 through the NMOS transistor 7 to the ground. However, the NMOS transistor 11 functioning as a constant current source in the saturation region has a very high ON-state resistance which generates a large potential difference. Therefore, the output signal potential Vout1 is not sufficiently lowered to the ground potential to cause a circuit at the next stage not to recognize the potential as "L" and not to operate.

The differential latch circuit of FIG. 13 normally receives the signals differentially amplified by the differential amplifiers 12 and 13 as shown in FIG. 11. At this time, the input signal potentials Vin1 and Vin2 are often deviated greatly from the threshold voltage of the differential latch circuit. As shown in FIG. 14, after the transition from the through mode to the latch mode, the output signal potentials Vout1 and Vout2 temporarily fall down, and require much time to determine the "H" or "L" level. Such a delay in level determination causes a delay of the time at which the circuit at the next stage starts processing the logic signals outputted from the differential latch circuit, resulting in a delay in the entire operation of the digital circuit at the next stage.

SUMMARY OF THE INVENTION

According to a first aspect of the present invention, a differential latch circuit comprises: a first load resistor having a first terminal connected to a first power supply terminal, and a second terminal connected to a first node; a second load resistor having a first terminal connected to the first power supply terminal, and a second terminal connected to a second node; a first transistor having a first electrode, a second electrode, and a control electrode connected to a first input terminal; a second transistor having a first electrode, a second electrode, and a control electrode connected to a second input terminal; a constant current source having a first terminal directly connected to the second electrodes of the first and second transistors, and a second terminal directly connected to a second power supply terminal; a latch circuit receiving signals from the first and second nodes for generating two complementary logic signals from the voltages of the received signals to output the two complementary logic signals from first and second output terminals; a first switch circuit for simultaneously making electrical connection or disconnection between the first node and the first transistor and between the second node and the second transistor; and a second switch circuit for outputting the signals at the first and second nodes intactly from the first and second output terminals, respectively, when the first switch circuit is in a connection mode and for operating the latch circuit when the first switch circuit is in a disconnection mode.

Preferably, according to a second aspect of the present invention, the second switch circuit comprises a seventh transistor directly connected between the second electrode of the third transistor and the second power supply terminal and between the second electrode of the fourth transistor and the second power supply terminal.

According to a third aspect of the present invention, a differential latch circuit comprises: a first load resistor connected between a first power supply terminal and a first node, the first node being connected to a first output terminal; a second load resistor connected between the first power supply terminal and a second node, the second node being connected to a second output terminal; a first transistor having a first electrode connected to the first node, a second electrode, and a control electrode connected to a first input terminal; a second transistor having a first electrode connected to the second node, a second electrode, and a control electrode connected to a second input terminal; a third transistor having a first electrode connected to the first node, a second electrode connected to a second power supply terminal, and a control electrode connected to the second node; a fourth transistor having a first electrode connected to the second node, a second electrode connected to the second power supply terminal, and a control electrode connected to the first node; a constant current source having a first terminal directly connected to the second electrodes of the first and second transistors, and a second terminal directly connected to the second power supply terminal; a first switch circuit for simultaneously making electrical connection or disconnection between the first node and the first electrode of the first transistor and between the second node and the second transistor; and a second switch circuit operating in complementary relation to the first switch circuit for simultaneously making electrical connection or disconnection between the first node and the third transistor and between the second node and the fourth transistor.

According to a fourth aspect of the present invention, a differential latch circuit comprises: a first load resistor connected between a first power supply terminal and a first node, the first node being connected to a first output terminal; a second load resistor connected between the first power supply terminal and a second node, the second node being connected to a second output terminal; a first MOS transistor having a first electrode connected to the first node, a second electrode, and a gate electrode connected to a first input terminal; a second MOS transistor having a first electrode connected to the second node, a second electrode, and a gate electrode connected to a second input terminal; a third MOS transistor having a first electrode connected to the first node, a second electrode connected to a second power supply terminal, and a gate electrode connected to the second node; a fourth MOS transistor having a first electrode connected to the second node, a second electrode connected to the second power supply terminal, and a gate electrode connected to the first node; a fifth MOS transistor having a first electrode directly connected to the second electrodes of the first and second MOS transistors, a second electrode directly connected to the second power supply terminal, and a gate electrode; a first switch circuit for simultaneously making electrical connection or disconnection between the first node and the first MOS transistor and between the second node and the second MOS transistor; and a second switch circuit operating in complementary relation to the first switch circuit for simultaneously making electrical connection or disconnection between the first node and the third MOS transistor and between the second node and the fourth MOS transistor.

Preferably, according to a fifth aspect of the present invention, the first electrode of the fifth MOS transistor is directly connected to the second electrodes of the third and fourth MOS transistors, and the second switch circuit comprises: an eighth MOS transistor connected between the first node and the first electrode of the third MOS transistor; and a ninth MOS transistor connected between the second node and the first electrode of the fourth MOS transistor.

Preferably, according to a sixth aspect of the present invention, the first switch circuit comprises: first selecting means for selecting one of an input signal applied to the first input terminal and a signal having a potential for forcing the first MOS transistor into non-conduction to apply the selected signal to the gate electrode of the first MOS transistor; and second selecting means for selecting one of an input signal applied to the second input terminal and a signal having a potential for forcing the second MOS transistor into non-conduction to apply the selected signal to the gate electrode of the second MOS transistor.

Preferably, according to a seventh aspect of the present invention, the first switch circuit comprises selecting means for selecting one of a signal having a potential for forcing the fifth MOS transistor into conduction and a signal having a potential for forcing the fifth MOS transistor into non-conduction to apply the selected signal to the gate electrode of the fifth MOS transistor.

According to an eighth aspect of the present invention, a differential latch circuit comprises: a differential amplifier circuit receiving a first input signal and a second input signal for differentially amplifying the first and second input signals to output the amplified signals from first and second output terminals, respectively; a first inverter circuit receiving the signal outputted from the first output terminal; a second inverter circuit receiving the signal outputted from the second output terminal; a first switch circuit for selecting a signal applied to a first input terminal or an output signal from the first inverter circuit to provide the first input signal; and a second switch circuit for selecting a signal applied to a second input terminal or an output signal from the second inverter circuit to provide the second input signal.

In the differential latch circuit according to the first aspect of the present invention, the turning on of the first switch circuit causes the differential amplification of the signals applied to the first and second input terminals to provide the amplified signals from the first and second output terminals. Since the constant current source is connected at its first terminal to the first and second MOS transistors and connected at its second terminal directly to the second power supply voltage, the first switch circuit may make the electrical connection between the first node and first transistor and between the second node and second transistor without a voltage drop across the constant current source. The differential amplification of the two input signals is correctly performed without the loss of the constant current source function.

In the second aspect of the present invention, the turning on of the second switch circuit causes the latch operation of the third and fourth MOS transistors. The second switch circuit is comprised of the MOS transistor directly connected between the third MOS transistor and second power supply voltage and between the fourth MOS transistor and second power supply voltage. Thus only the voltage drop by the MOS transistor serving as the second switch circuit occurs between the third and fourth MOS transistors and the second power supply terminal, and one of the logic levels of the first and second output terminals can sufficiently approach the potential of the second power supply terminal. Therefore, the logic signal having a sufficiently wide output range is applied to a digital circuit at the next stage, and the clarified logic level is transmitted to the digital circuit.

In the differential latch circuit according to the third aspect of the present invention, the turning on of the first switch circuit causes the differential amplification of the signals applied to the first and second input terminals to provide the amplified signals from the first and second output terminals. Since the constant current source is connected at its first terminal to the first and second MOS transistors and connected at its second terminal directly to the second power supply voltage, the first switch circuit may make the electrical connection between the first node and first transistor and between the second node and second transistor without a voltage drop across the constant current source. The differential amplification of the two input signals is correctly performed without the loss of the constant current source function.

In the differential latch circuit according to the fourth aspect of the present invention, the turning on of the first switch circuit causes the differential amplification of the signals applied to the first and second input terminals to provide the amplified signals from the first and second output terminals. Since the fifth MOS transistor serving as the constant current source is connected at its first terminal to the first and second MOS transistors and connected at its second terminal directly to the second power supply voltage, the first switch circuit may make the electrical connection between the first node and first MOS transistor and between the second node and second MOS transistor without a voltage drop across the fifth MOS transistor. The differential amplification of the two input signals is correctly performed without the loss of the constant current source function.

In the differential latch circuit according to the fifth aspect of the present invention, the fifth MOS transistor is connected at its first electrode to the second electrodes of the third and fourth MOS transistors, and the second switch circuit includes the sixth MOS transistor connected between the first node and the first electrode of the third MOS transistor and the seventh MOS transistor connected between the second node and the first electrode of the fourth MOS transistor. The circuit connection between the first switch circuit which functions during the differential amplification, the first and second MOS transistors and the fifth MOS transistor is identical with the circuit connection between the second switch circuit which functions during the latch operation, the third and fourth MOS transistors, and the fifth MOS transistor. After the transition from the differential amplification to the latch operation, predetermined logic level is determined at the first and second output terminals without any conflict of the signal voltages. Thus the digital circuit at the next stage can rapidly process the applied digital signals.

The first switch circuit of the differential latch circuit according to the sixth aspect of the present invention comprises the first selecting means for selectively applying one of the input signal applied to the first input terminal and the signal having the potential which forces the first MOS transistor into non-conducting state to the gate electrode of the first MOS transistor, and the second selecting means for selectively applying one of the input signal applied to the second input terminal and the signal having the potential which forces the second MOS transistor into the non-conducting state to the gate electrode of the second MOS transistor. When the first switch circuit makes the electrical connection between the first node and the second power supply voltage and between the second node and the second power supply voltage, the differential amplification is achieved with a low voltage, thereby reducing power consumption.

The first switch circuit of the differential latch circuit according to the seventh aspect of the present invention comprises the third selecting means for selectively applying one of the signal having the potential at the second node and the signal having the potential which forces the third MOS transistor into the non-conducting state to the gate electrode of the third MOS transistor, and the fourth selecting means for selectively applying one of the signal having the potential at the first node and the signal having the potential which forces the fourth MOS transistor into the non-conducting state to the gate electrode of the fourth MOS transistor. When the first switch circuit makes the electrical connection between the first node and the second power supply voltage and between the second node and the second power supply voltage, the differential amplification is achieved with a low power supply voltage, thereby reducing power consumption.

The differential latch circuit according to the eighth aspect of the present invention comprises the differential amplifier circuit receiving the first and second input signals for differentially amplifying the first and second input signals to output the amplified signals from the first and second output terminals, the first inverter circuit receiving the signal outputted from the first output terminal, the second inverter circuit receiving the signal outputted from the second output terminal, the first switch circuit for selecting the signal applied to the first input terminal or the output signal from the first inverter circuit to provide the first input signal, and the second switch circuit for selecting the signal applied to the second input terminal or the output signal from the second inverter circuit to provide the second input signal. This differential amplifier circuit can control the two signal potentials outputted in the through mode to approach the threshold voltages of the first and second inverter circuits. Thus, in a latch mode, the first and second inverter circuits respectively receive the two signals to allow the first and second output terminals to rapidly determine and output the complementary logic levels, permitting the digital circuit at the next stage to rapidly process the digital signals applied thereto.

It is an object of the present invention to provide a high-performance differential latch circuit which performs good differential amplification in a through mode and performs a latch operation for normally determining "H" or "L" in a latch mode.

It is another object of the present invention to provide a differential latch circuit which performs a latch operation at high speeds in a latch mode for rapid processing of an output digital signal.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
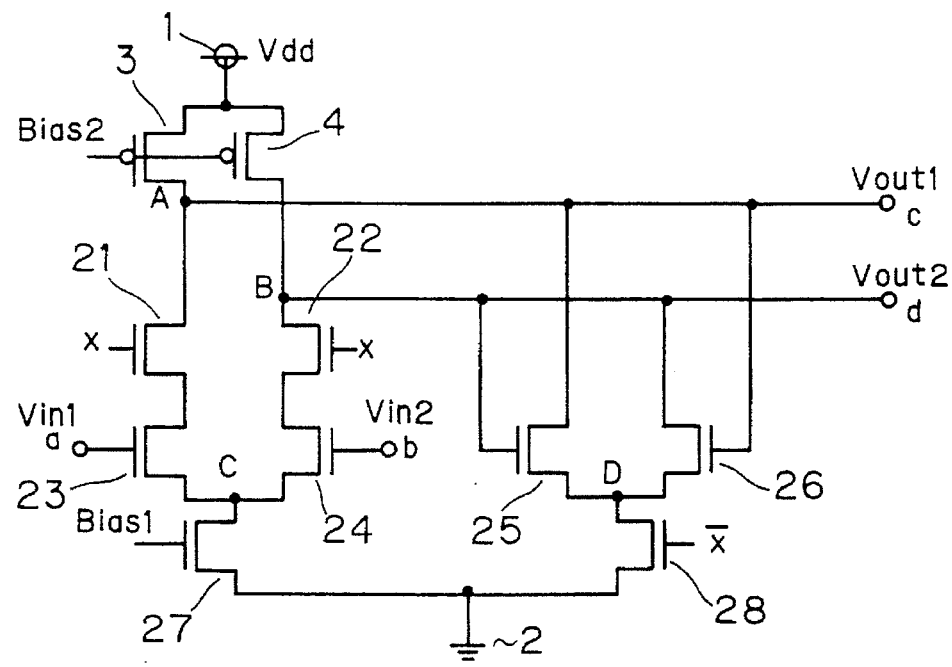
FIG. 1 is a circuit diagram of a differential latch circuit according to a first preferred embodiment of the present invention.

A first preferred embodiment according to the present invention will now be described. FIG. 1 is a circuit diagram of a differential latch circuit according to the first preferred embodiment of the present invention.

In FIG. 1, the reference numeral 1 designates a power supply voltage (referred to hereinafter as Vdd); 2 designates a ground voltage (referred to hereinafter as Vss); 3 and 4 designate PMOS transistors each having a source terminal connected to the Vdd 1 and serving as an active load resistor; and 21 through 28 designate NMOS transistors. The reference characters a and b designate input terminals receiving input signals; c and d designate output terminals for providing logic signals; and A and B designate nodes connected respectively to the output terminals c and d.

At the node A, the drain terminals of the PMOS transistor 3 and NMOS transistors 21, 25 and the gate electrode of the NMOS transistor 26 are connected together. At the node B, the drain terminals of the PMOS transistor 4 and NMOS transistors 22, 26 and the gate electrode of the NMOS transistor 25 are connected together. The drain terminal of the NMOS transistor 23 is connected to the source terminal of the NMOS transistor 21. The drain terminal of the NMOS transistor 24 is connected to the source terminal of the NMOS transistor 22. The source terminals of the NMOS transistors 23, 24 are commonly connected to the drain terminal of the NMOS transistor 27. The reference character C designates a node at which the NMOS transistors 23, 24, 27 are commonly connected. The source terminals of the NMOS transistors 25, 26 are commonly connected to the drain terminal of the NMOS transistor 28. The reference character D designates a node at which the NMOS transistors 25, 26, 28 are commonly connected. The source terminals of the NMOS transistors 27, 28 are commonly connected to the Vss 2. The input terminals a and b are connected respectively to the gate electrodes of the NMOS transistors 23 and 24.

The reference characters Vin1 and Vin2 designate the potentials of the input signals applied to the input terminals a and b, respectively; Vout1 and Vout2 designate the potentials of the output signals outputted from the output terminals c and d, respectively; Bias1 designates a bias voltage applied to the gate electrode of the NMOS transistor 27 to operate the NMOS transistor 27 as a constant current source in a saturation region; and Bias2 designates a bias voltage commonly applied to the gate electrodes of the PMOS transistors 3, 4 to operate the PMOS transistors 3, 4 as active load resistors in the saturation region.

The reference character X designates a digital signal applied to the gate electrodes of the NMOS transistors 21, 22, and $\overline{X}$ designates a digital signal applied to the gate electrode of the NMOS transistor 28. The signals X and $\overline{X}$ are complementary digital signals for controlling the switching between a through mode and a latch mode in the differential latch circuit. The NMOS transistors 21, 22 and 28 serve as switches, and receive the control signals X and $\overline{X}$ so as to operate in a linear region in the ON state. The Vdd 1 is generally used as the H level of the control signals X and $\overline{X}$.

The operation of the differential latch circuit is described below.

Analog signal voltages are constantly applied to the input terminals a and b. The differential latch circuit is in the through mode when X=H and $\overline{X}$=L, and is in the latch mode when X=L and $\overline{X}$=H. The through mode and latch mode are alternately repeated at predetermined time intervals.

(1) X=H and $\overline{X}$=L (through mode)

The NMOS transistors 21 and 22 are ON, and the NMOS transistor 28 is OFF. Current generated by the NMOS transistor 27 serving as a constant current source flows between the Vdd i and the node C, and the NMOS transistors 23, 24, 27 and PMOS transistors 3, 4 form a differential amplifier circuit. The terminals c and d provide the output potentials Vout1 and Vout2 having a potential difference based on the potential difference between the input potentials Vin1 and Vin2. The node D is not electrically connected to the Vss 2, which does not permit the NOS transistors 25, 26 to perform the latch operation.

(2) X=L and $\overline{X}$=H (latch mode)

Conversely, the NMOS transistors 21 and 22 are OFF, and the NMOS transistor 28 is ON. The node D is electrically connected to the Vss 9 and the NMOS transistors 25, 26 form a latch circuit. No current flows from the Vdd 1 to the node C, which does not permit the differential amplification of the input potentials Vin1 and Vin2.

When Vin1>Vin2 in the through mode immediately prior to the start of the latch mode, the output potentials Vout1 and Vout2 are set so that the potential difference satisfies Vout1<Vout2. Upon switching to the latch mode, the output potential Vout1 is the gate voltage of the NMOS transistor 26 and the output potential Vout2 is the gate voltage of the NMOS transistor 25. Then the drain current of the NMOS transistor 25 is greater than the drain current of the NMOS transistor 26. This further decreases the output potential Vout1 which is the drain potential of the NMOS transistor 25 and further increases the output potential Vout2 which is the drain potential of the NMOS transistor 26. The interaction such that the increase in output potential Vout2 accelerates the decrease in output potential Vout1 and vice versa determines Vout1=L and Vout2=H. When Vin1<Vin2 immediately prior to the start of the latch mode, the inverted operation is performed to determine Vout1=H and Vout2=L. In this manner, digital signals are outputted form the output terminals c and d.

The differences between the differential latch circuit of this preferred embodiment and the differential latch circuit of FIG. 10 will be discussed below.

(1) In the through mode

In FIG. 1, the potential at the node C is represented by V1, the drain potential of the NMOS transistor 23 is represented by V2, and the potential at the node A is represented by V3. In FIG. 10, the potential at the node E is represented by V01, the potential at the node C is represented by V02, and the potential at the node A is represented by V03.

Figure 10:
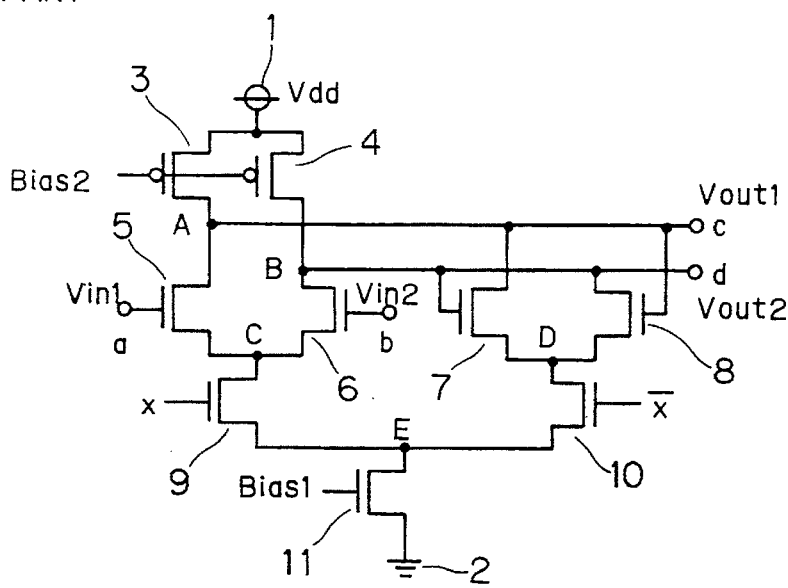
FIG. 10 is a circuit diagram of a conventional differential latch circuit.

The potential at the node C in the differential latch circuits of FIGS. 1 and 10 significantly depends upon the input potentials Vin1 and Vin2 applied to the input terminals a and b and may be considered as a function of only the input potentials Vin1 and Vin2. Thus, the potentials V1 and V02 of FIGS. 1 and 10 at the node C are substantially equal when the NMOS transistors 23, 5 and the NMOS transistors 24, 6 are completely the same transistors and the same potentials Vin1 and Vin2 are applied to the input terminals a and b. The drain-source voltage V1 of the NMOS transistor 27 serving as the constant current source of FIG. 1 is greater than the drain-source voltage V01 of the NMOS transistor 11 of FIG. 10. Therefore, the NMOS transistor 27 in the differential latch circuit of this preferred embodiment prevents the decrease in the drain-source voltage and the loss of the constant current source function.

With continued reference to FIG. 1, a voltage (V3−V2) across the NMOS transistor 21 causes the drain-source voltage (V2−V1) of the NMOS transistor 23 to be lower than the drain-source voltage (V03−V02) of the NMOS transistor 5 of FIG. 10 and causes the drain-source voltage (Vdd−V3) of the PMOS transistor 3 to be lower than the drain-source voltage (Vdd−V03) of the PMOS transistor 3 of FIG. 10. However, the voltage (V3−V2) across the NMOS transistor 21 is distributed to the NMOS transistor 23 and PMOS transistor 3 to drop the drain-source voltages of the transistors 23 and 3. Thus the amount of drain-source voltage drop is not great enough to operate the NMOS transistor 23 and PMOS transistor 3 in the linear region. On the other hand, in the differential latch circuit of FIG. 10, the amount of voltage (V02−V01) across the NMOS transistor 9 is the drain-source voltage of the NMOS transistor 11 which might cause the NMOS transistor 11 to operate in the linear region.

Likewise, when the NMOS transistor 22 is provided, the reduction in the potential difference between the drain and source of the NMOS transistor 24 and PMOS transistor 3 is not great enough to operate the respective transistors in the linear region.

As above stated, the drain-source voltage of the NMOS transistor 21 is distributed to the NMOS transistor 23 and PMOS transistor 3 to drop the drain-source voltages of the transistors 23 and 3, and the drain-source voltage of the NMOS transistor 22 is distributed to the NMOS transistor 24 and PMOS transistor 4 to drop the drain-source voltages of the transistors 24 and 4. This provides a wider range of the signal voltages applicable to the input terminals a and b than that of the differential latch circuit of FIG. 10.

For example, it is assumed that the input potential ranges from 1.5 to 2.0 V in FIG. 10. The upper limit of the potential range is a maximum gate voltage for operating the NMOS transistor 5 (or 6) in the saturation region, and the lower limit thereof is a minimum gate voltage for operating the NMOS transistor 11 as a constant current source in the saturation region. However, as above noted, since the drain-source voltage of the NMOS transistor 21 of FIG. 1 is distributed to the NMOS transistor 23 and PMOS transistor 3 to drop the drain-source voltages of the transistors 23 and 3, the amount of voltage drop is less than the amount of drain-source voltage drop of the NMOS transistor 11 which is caused by the provision of the NMOS transistor 9 of FIG. 10. Thus, the upper limit of the input potential range in the circuit of FIG. 1 is lower than that of FIG. 10, but the lower limit is much lower. The differential latch circuit of FIG. 1 has an input potential range of 1.0 to 1.8 V whereas the differential latch circuit of FIG. 10 has the input potential range of 1.5 to 2.0 V. The wider input potential range allows sufficient differential amplification with a relatively large amplitude of the input signal to eliminate the need to adjust the voltage level of the input signal before inputted, fostering versatility of the differential latch circuit.

In the arrangement of FIG. 1, the NMOS transistors 25, 26 form the latch circuit, and the NMOS transistor 28 forms the switch circuit. However, the present invention is not limited to this arrangement. The latch circuit is required only to receive the signals at the nodes A and B to generate two complementary logic signals from the signal voltages. The switch circuit is required, in the through mode, only to output the signals at the nodes A and B intactly from the output terminals c and d and, in the latch mode, to place the latch circuit into the latch operation to produce two complementary logic signals from the signals at the nodes A and B to output the two complementary logic signals from the output terminals c and d. Such latch and switch circuits provide effects described above. The latch circuit and switch circuit may be formed by MOS transistors, bipolar transistors, and a combination thereof.

(2) In the latch mode

In the differential latch circuit of FIG. 1, when the terminal c indicates the L level, the terminal c is electrically connected to the Vss 2 through the NMOS transistors 25, 28. However, since the electrical connection between the terminal c and the Vss 2 is not made through a constant current source such as the NMOS transistor 11 of FIG. 10, the potential at the terminal c may be reduced to about the Vss 2. This provides a wide range of the output voltages. The logic signals having a sufficiently wide output range are applied to a digital circuit connected at the next stage to clarify the L level to be transmitted to the next-stage circuit.

In the arrangement of FIG. 10, the L level is determined by extracting electrons through the NMOS transistor 11 serving as the constant current source. In particular, a very large ON-state resistance of the NMOS transistor 11 operating in the saturation state causes slow extraction of electrons. However, the differential latch circuit of FIG. 1 extracts electrons through the NMOS transistor 28 at high speeds, thereby rapidly determining the L level. This permits early start of the digital signal processing by the circuit at the next stage of the differential latch circuit of FIG. 1.

The above described effects may be obtained by directly connecting the node D and Vss 2 and connecting transistors identical with the NMOS transistor 28 between the node A and the NMOS transistor 25 and between the node B and the NMOS transistor 26.

The differential latch circuit may be constructed such that the Vdd (power supply) and Vss (ground) are interchanged and the NMOS transistors and PMOS transistors are interchanged. The differential latch circuit of FIG. 1 comprises only the MOS transistors but may comprise bipolar transistors. Specifically, the PMOS transistors may be replaced with pnp bipolar transistors and the NMOS transistors be replaced with npn bipolar transistors, with the source, drain and gate terminals associated respectively with emitter, collector and base terminals. The gate electrodes of the MOS transistors and the base electrodes of the bipolar transistors are generally referred to as control electrodes (or control terminals).

Second Preferred Embodiment

Figure 2:
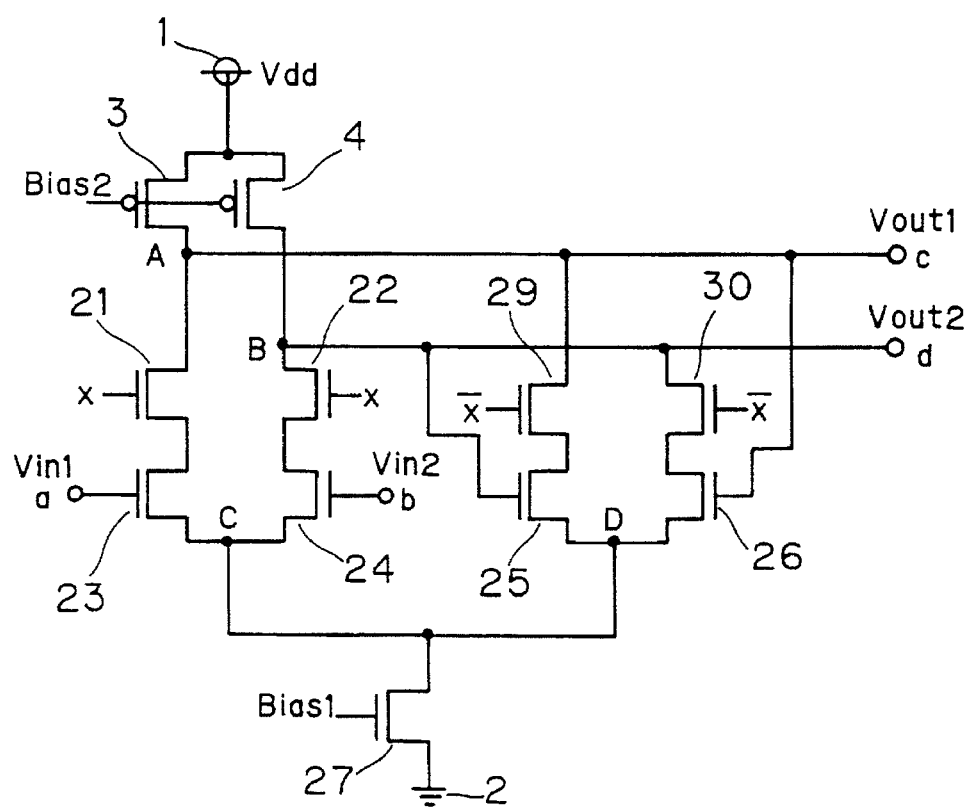
FIG. 2 is a circuit diagram of the differential latch circuit according to a second preferred embodiment of the present invention.

FIG. 2 shows a modification of the differential latch circuit of the first preferred embodiment. In FIG. 2, the reference numeral 29 designates an NMOS transistor between the node A and the NMOS transistor 25; and 30 designates an NMOS transistor between the node B and the NMOS transistor 26. The drain terminal of the NMOS transistor 27 acting as the constant current source in the through mode is connected to the node C and the node D. The NMOS transistors 29 and 30 have the function of switches operating in the linear region. The signal $\overline{X}$ is applied to the gate electrodes of the NMOS transistors 29, 30. Other reference numerals and characters of FIG. 2 designate parts identical with or corresponding to those of FIG. 1.

The basic operation of the differential latch circuit of FIG. 2 is similar to that of the first preferred embodiment.

(1) X=H and $\overline{X}$=L (through mode)

The NMOS transistors 21 and 22 are ON, and the NMOS transistors 29 and 30 are OFF. The nodes A, B are electrically connected to the node C, and the NMOS transistors 23, 24, 27 and PMOS transistors 3, 4 form the differential amplifier circuit responsive to the input potentials Vin1 and Vin2.

(2) X=L and $\overline{X}$=H (latch mode)

The NMOS transistors 21 and 22 are OFF, and the NMOS transistors 29 and 30 are ON. The nodes A, B are electrically connected to the node D, and the NMOS transistors 25, 26 form the latch circuit in the same manner as in FIG. 1.

In FIG. 2, the connection and arrangement of the NMOS transistors 21, 22 serving as the switch circuit operating in the through mode and the NMOS transistors 23, 24 forming the differential amplifier circuit is identical with the connection and arrangement of the NMOS transistors 29, 30 serving as the switch circuit operating in the latch mode and the NMOS transistors 25, 26 serving as the latch circuit. In this case, a matching property in the operating characteristics is improved in the transistor circuit operating in the through mode and the transistor circuit operating in the latch mode.

For example, the threshold voltage of an input signal which determines the logic level in a circuit performing latch operation significantly depends on the connection and arrangement of a transistor receiving the input signal. The good matching property of the circuit means that the output potentials Vout1 and Vout2 outputted in the through mode are subjected to differential amplification to provide values which are very close to the threshold voltage of the circuit performing the latch operation. Therefore, after the transition from the through mode to the latch mode, the signal level "H" or "L" is rapidly determined from the values of the output potentials Vout1, Vout2 at the transition instant, allowing early start of the digital signal processing by the circuit at the next stage of the differential latch circuit.

Figure 14:
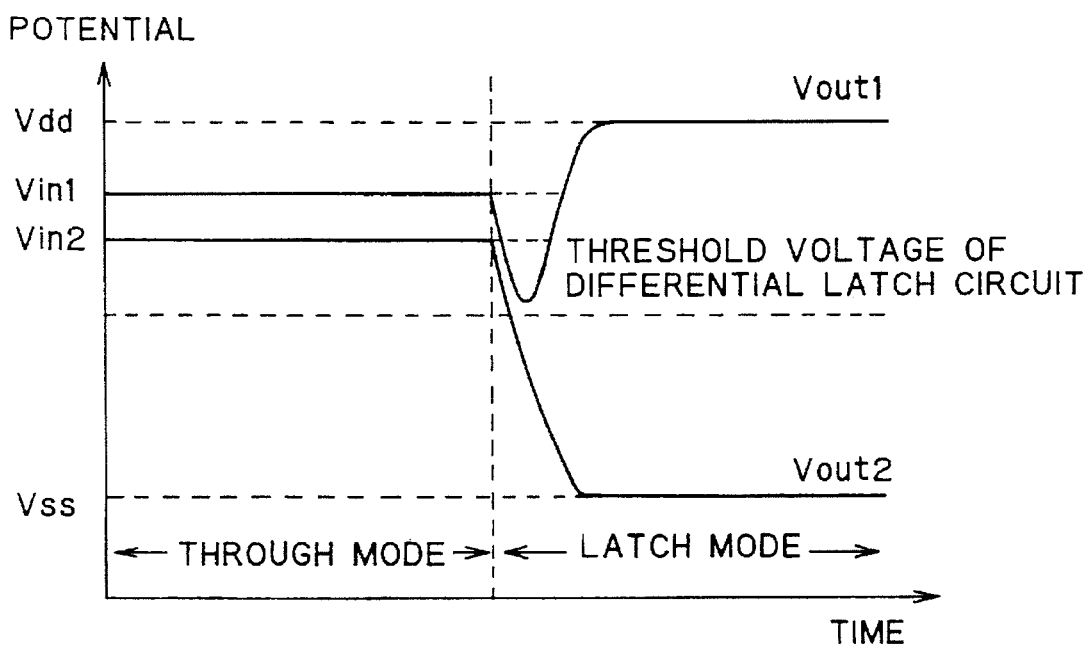
FIG. 14 is a timing chart showing output signal potentials versus time in the differential latch circuit of FIG. 13.

When the matching property of the circuit is not satisfactory, both of the output potentials Vout1 and Vout2 are often greatly deviated from the threshold value in the through mode. As shown basically in the timing chart of FIG. 14, the voltage conflict has occurred in such a manner that the output potentials Vout1 and Vout2 temporarily approach the threshold value after the transition from the through mode to the latch mode, and it has taken time to determine the signal level in the latch operation.

Third Preferred Embodiment

Figure 3:
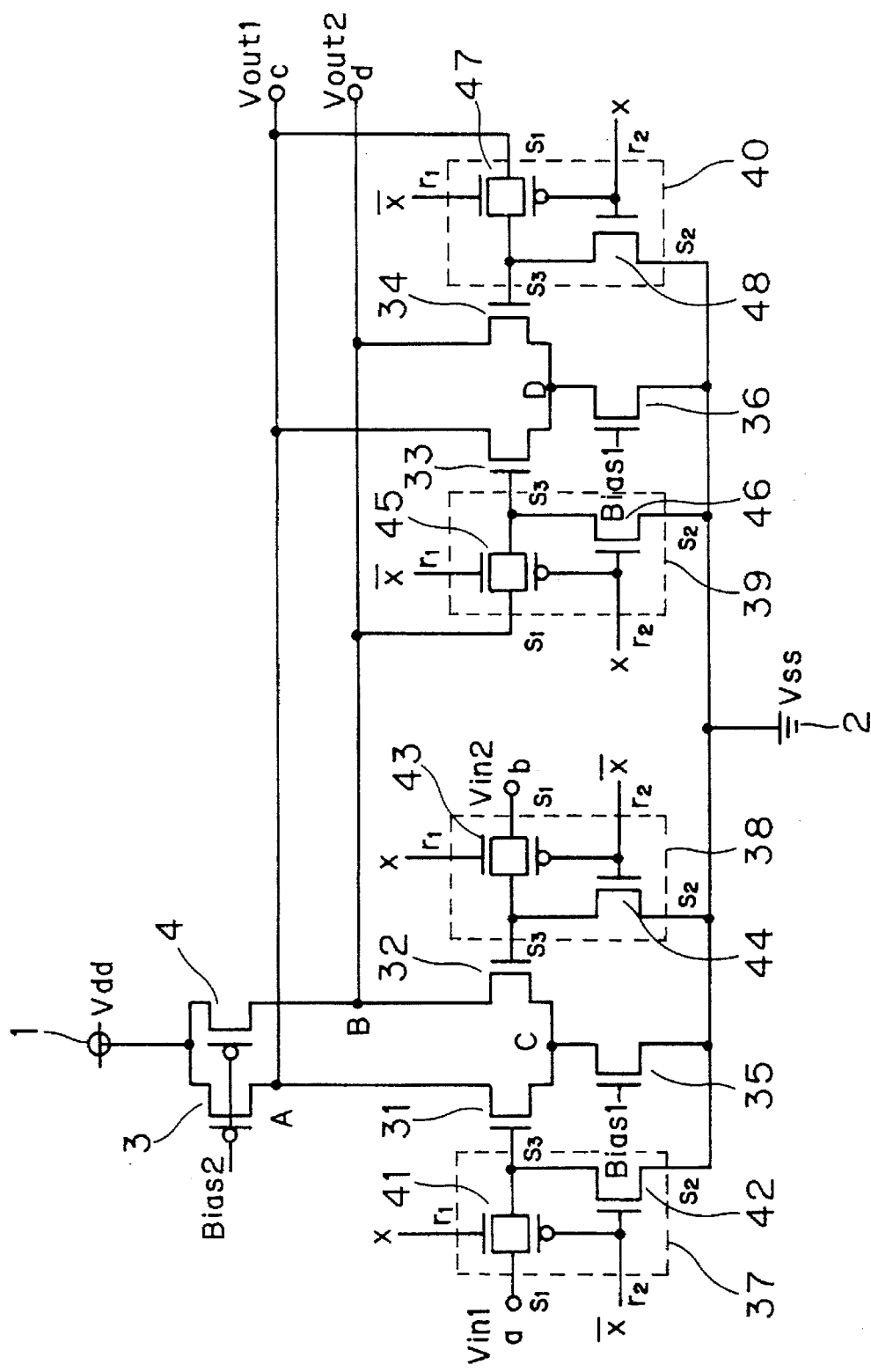
FIG. 3 is a circuit diagram of the differential latch circuit according to a third preferred embodiment of the present invention.

FIG. 3 is a circuit diagram of the differential latch circuit according to a third preferred embodiment of the present invention. In FIG. 3, the reference numerals 3 and 4 designate PMOS transistors each having a source terminal connected to the Vdd 1 and serving as an active load resistor; and 31 through 36 designate NMOS transistors. The reference characters a and b designate input terminals receiving input signals; c and d designate output terminals for providing logic signals; and A and B designate nodes connected to the output terminals c and d, respectively.

At the node A, the drain terminals of the PMOS transistor 3 and NMOS transistors 31, 33 are connected together. At the node B, the drain terminals of the PMOS transistor 4 and NMOS transistors 32, 34 are connected together. The source terminals of the NMOS transistors 31, 32 are commonly connected to the drain terminal of the NMOS transistor 35. The source terminals of the NMOS transistors 33, 34 are commonly connected to the drain terminal of the NMOS transistor 36. The reference character C designates a node commonly connected to the NMOS transistors 31, 32, 35; and D designates a node commonly connected to the NMOS transistors 33, 34, 36. The source terminals of the NMOS transistors 35, 36 are commonly connected to the Vss 2.

The reference numerals 37 through 40 designate switch circuits each having s1, s2, s3, r1, r2 terminals. For example, the switch circuit 37 includes a transmission gate 41 and an NMOS transistor 42 operating in the linear region, with the r1 terminal connected to the gate electrode of an NMOS transistor of the transmission gate 41, the r2 terminal connected to the gate electrode of a PMOS transistor of the transmission gate 41 and to the gate electrode of the NMOS transistor 42, the s1 terminal connected to a first terminal of the transmission gate 41, the s2 terminal connected to a first terminal of the NMOS transistor 42, and the s3 terminal connected to second terminals of the transmission gate 41 and NMOS transistor 42.

The switch circuit 38 includes a transmission gate 43, and an NMOS transistor 44 operating in the linear region. The switch circuit 39 includes a transmission gate 45, and an NMOS transistor 46 operating in the linear region. The switch circuit 40 includes a transmission gate 47, and an NMOS transistor 48 operating in the linear region. The switch circuits 38 to 40 are identical in construction with the switch circuit 37.

The s1 terminal of the switch circuit 37 is connected to the input terminal a, the s2 terminal thereof is connected to the Vss 2, and the s3 terminal thereof is connected to the gate electrode of the NMOS transistor 31. The s1 terminal of the switch circuit 38 is connected to the input terminal b, the s2 terminal thereof is connected to the Vss 2, and the s3 terminal thereof is connected to the gate electrode of the NMOS transistor 32. The s1 terminal of the switch circuit 39 is connected to the node A, the s2 terminal thereof is connected to the Vss 2, and the s3 terminal thereof is connected to the gate electrode of the NMOS transistor 33. The s1 terminal of the switch circuit 40 is connected to the node B, the s2 terminal thereof is connected to the Vss 2, and the s3 terminal thereof is connected to the gate electrode of the NMOS transistor 34.

The signals X and $\overline{X}$, similar to those of the first preferred embodiment, are complementary digital signals for controlling the switching between the through mode and the latch mode of the differential latch circuit. The signal X is applied to the r1 terminals of the switch circuits 37, 38 and the r2 terminals of the switch circuits 39, 40. The signal $\overline{X}$ is applied to the r2 terminals of the switch circuits 37, 38 and the r1 terminals of the switch circuits 39, 40.

The reference characters Vin1 and Vin2 designate the potentials of the input signals applied to the input terminals a and b, respectively; Vout1 and Vout2 designate the potentials of the output signals outputted form the output terminals c and d, respectively; Bias1 designates a bias voltage commonly applied to the gate electrodes of the NMOS transistors 35, 36 to operate the NMOS transistors 35, 36 as constant current sources in the saturation region; and Bias2 designates a bias voltage commonly applied to the gate electrodes of the PMOS transistors 3, 4 to operate the PMOS transistors, 3, 4 as active load resistors in the saturation region.

First, the operation of the switch circuits 37 to 40 will be described.

In the switch circuits 37 and 38, when X=H and $\overline{X}$=L, the transmission gates 41, 43 are ON and the NMOS transistors 42, 44 are OFF. Then the signal applied to the s1 terminal is outputted from the s3 terminal. On the other hand, when X=L and $\overline{X}$=H, the transmission gates 41, 43 are OFF and the NMOS transistors 42, 44 are ON. Then the signal applied to the s2 terminal is outputted from the s3 terminal.

In the switch circuits 39 and 40, when X=H and $\overline{X}$=L, the transmission gates 45, 47 are OFF and the NMOS transistors 46, 48 are ON. Then the signal applied to the s2 terminal is outputted from the s3 terminal. On the other hand, when X=L and $\overline{X}$=H, the transmission gates 45, 47 are ON and the NMOS transistors 46, 48 are OFF. Then the signal applied to the s1 terminal is outputted from the s3 terminal.

The operation of the differential latch circuit of FIG. 3 is discussed below. Like the first and second preferred embodiments, analog signal voltages are applied to the input terminals a and b.

(1) X=H and $\overline{X}$=L (through mode)

The switch circuits 37 and 38 select the analog input signals applied to the input terminals a and b to output the selected signals from the s3 terminal, respectively. Then the input potential Vin1 is applied to the gate electrode of the NMOS transistor 31, and the input potential Vin2 is applied to the gate electrode of the NMOS transistor 32. The NMOS transistor 35 serving as the constant current source, the PMOS transistors 3, 4 and the NMOS transistors 31, 32 form a differential amplifier circuit. The output terminals c and d provide the output potentials Vout1 and Vout2 having a potential difference based on the potential difference between the input potentials Vin1 and Vin2.

On the other hand, the switch circuits 39 and 40 select the Vss 2 to output the Vss 2 from the s3 terminal. The potential (0 V) of the Vss 2 is applied to the gate electrodes of the MOS transistors 33, 34. Then the NMOS transistors 33, 34 are both OFF, and cause no current to flow from the nodes A, B through the node D to the Vss 2.

(2) X=L and $\overline{X}$=H (latch mode)

The switch circuits 37, 38 select the potential of the Vss 2 to output the potential from the s3 terminal. Then the potential (0 V) of the Vss 2 is applied to the gate electrodes of the NMOS transistors 31, 32. Thus the NMOS transistors 31, 32 are OFF and cause no current to flow from the nodes A, B through the node C to the Vss 2. The differential amplifier circuit in the through mode is not formed.

On the other hand, the switch circuits 39, 40 select the potentials (Vout2, Vout1) at the nodes B, A to output the potentials from the s3 terminal, respectively. Then the node B is connected to the gate electrode of the NMOS transistor 33, and the node A is connected to the gate electrode of the NMOS transistor 34. The output terminals c and d determine the signal level "H" or "L" from the output potentials Vout1 and Vout2 at the instant of the transition from the through mode to the latch mode to output the complementary digital signals by the operation similar to that of the first and second preferred embodiments.

In the third preferred embodiment, the source terminals of the NMOS transistors 31, 32 are directly connected to the drain terminal of the NMOS transistor 35, permitting the NMOS transistor 35 to operate without the loss of the constant current source function of the differential amplifier circuit in the through mode, like the first and second preferred embodiments.

In particular, the MOS transistors serving as switches are not connected between the node A and the NMOS transistor 31 and between the node B and the NMOS transistor 32, thereby providing a wider input signal voltage range than that of the first and second preferred embodiments (a higher upper limit of the voltage range than that of the first and second preferred embodiments).

The circuit of the third preferred embodiment comprises only three MOS transistors in the circuit path extending from the Vdd 1 through the node C to the Vss 2, performing correct differential amplification in the through mode at a lower power supply voltage than the conventional circuit (FIG. 10) including the four MOS transistors therein. This reduces the power consumption of the entire circuit.

The circuit of FIG. 3 comprises the latch circuit consisting of the NMOS transistors 33 and 34, and the switch circuits 39 and 40. However, the present invention is not limited to such an arrangement. The latch circuit is required only to receive the signals at the nodes A and B to generate two complementary logic signals from the signal voltages. The switch circuit is required, in the through mode, only to output the signals at the nodes A and B intactly from the output terminals c and d and, in the latch mode, to place the latch circuit into the latch operation to produce two complementary logic signals from the signals at the nodes A and B to output the logic signals from the output terminals c and d. Such latch and switch circuits provide the above stated effects. For example, the circuit arrangement of the NMOS transistors 25, 26 and 28 of FIG. 1 may be replaced with the circuit arrangement of the NMOS transistors 33, 34 and 36 and switch circuits 39, 40 of FIG. 3.

Figure 4:
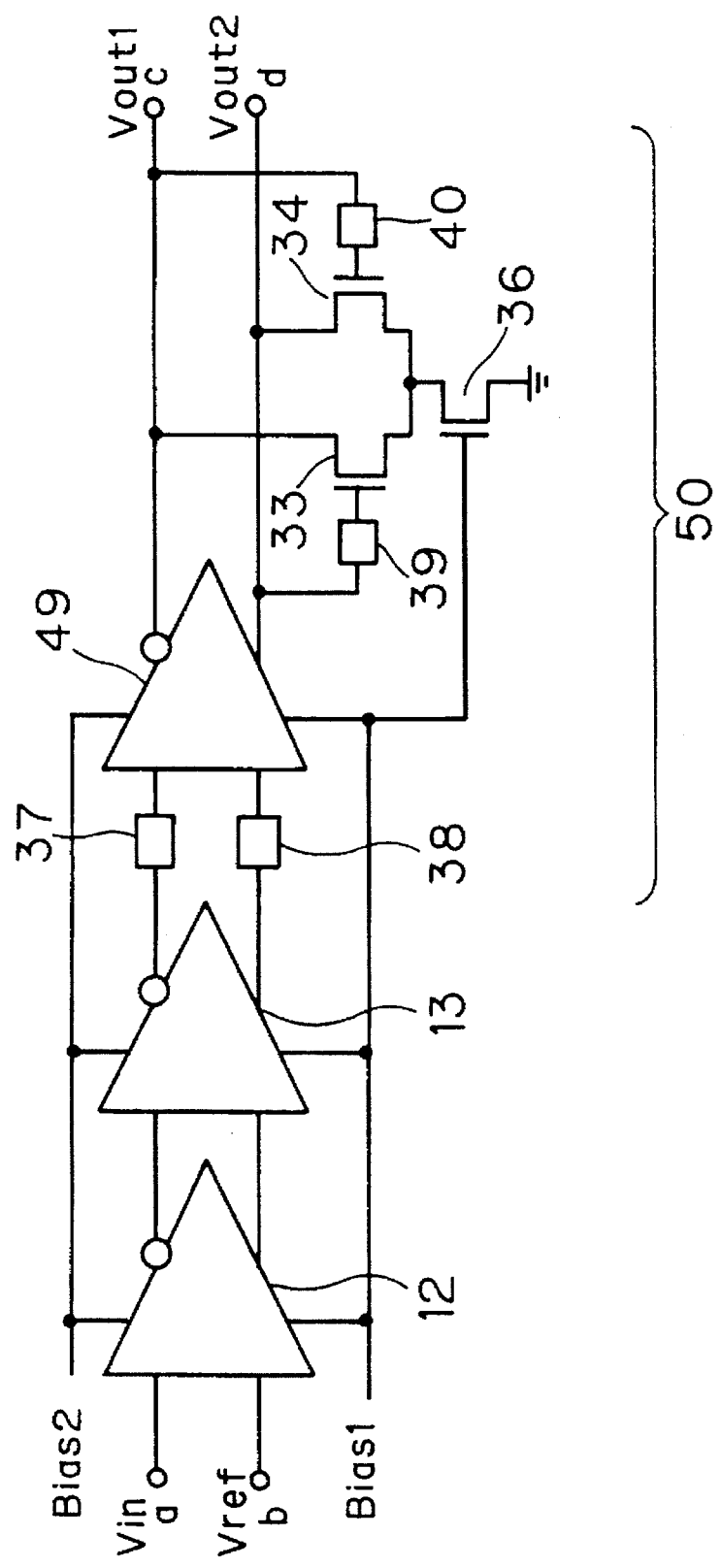
FIG. 4 is a circuit diagram of a voltage comparator employing the differential latch circuit of FIG. 3.
Figure 11:
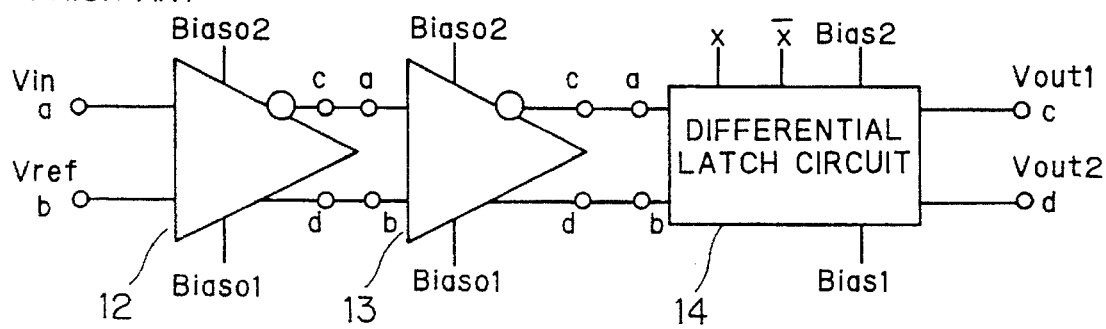
FIG. 11 is a circuit diagram of a conventional voltage comparator employing the differential latch circuit of FIG. 10.

FIG. 4 is a diagram showing the differential latch circuit of the third preferred embodiment for use in the voltage comparator of FIG. 11. The reference numeral 49 designates a differential amplifier circuit identical with that of FIG. 12 including the PMOS transistors 3, 4 and NMOS transistors 31, 32, 35. The portion denoted by the reference numeral 50 is the differential latch circuit of FIG. 3.

In the voltage comparator of FIG. 11, the differential amplifier 13 at the previous stage includes three MOS transistors connected in series, and the differential amplifier circuit portion formed in the through mode in the differential latch circuit 14 includes four MOS transistors connected in series. The differential amplifier 13 and the differential latch circuit 14 which are of different transistor constructions differ in various characteristics (e.g., DC operating point voltage, amplification gain) in differential amplifying function and, specifically, have unsatisfactory matching properties therebetween. This might cause insufficient differential amplification of the input signals for generation of the digital signals.

The bias voltages Bias01 and Bias02 for use in the differential amplifiers 12, 13 must differ from the bias voltages Bias1 and Bias2 for use in the differential latch circuit 14. The differential amplifiers 12, 13 and the differential latch circuit 14 are not permitted to use the common bias voltages but must use respective exclusive bias circuits, requiring excessive chip area, power consumption and time and labor for designing.

In the voltage comparator of FIG. 4, each of the differential amplifier 13 and the differential amplifier circuit portion of the differential latch circuit 50 includes three MOS transistors connected in series to provide good matching property therebetween, achieving the voltage comparator having good amplification gain. The bias voltages for use in the differential amplifiers 12, 13 and the bias voltages for use in the differential latch circuit of FIG. 3 may be common and the same. An arrangement in which the bias voltages Bias1 and Bias2 are commonly used is shown in FIG. 4.

In the voltage comparator of FIG. 4, the differential latch circuit 50 includes the switch circuits 37 to 40, and the NMOS transistors 33, 34, 36 in addition to the conventional differential amplifier 49, simplifying the circuit design and requiring less time and labor therefor.

In the arrangement of FIG. 3, the node D is connected to the Vss 2 through the NMOS transistor, and the connection of the NMOS transistors 31, 32, 35 operating during differential amplification is identical with the connection of the NMOS transistors 33, 34, 36, providing good circuit matching property as described in the second preferred embodiment. A direct connection of the node D to the Vss 2 enables the latch operation. This lowers the circuit matching property but permits high-speed determination of the "L" level since the NMOS transistor serving as the constant current source is not intervened like the first preferred embodiment.

All of the s2 terminals of the switch circuits 37 to 40 are connected to the Vss 2 in the third preferred embodiment, but the present invention is not limited thereto. The same operation is performed if the s2 terminals receive a voltage which does not operate the NMOS transistors 31, 32, 33 and 34. It is not particularly necessary to apply the same voltage to the s2 terminals of the switch circuits 37 to 40, but voltages to be applied thereto are required to turn off the NMOS transistors 31, 32, 33 and 34.

The arrangement of the switch circuits 37 to 40 is not limited to that of FIG. 3 but may be constructed to form a selecting circuit for selectively outputting one of the signals applied to the s1 and s2 terminals from the s3 terminal in response to the complementary digital signals X and $\overline{X}$.

In the differential latch circuit, the Vdd (power supply) and Vss (ground) may be interchanged, and the NMOS transistors and PMOS transistors may be interchanged.

The differential latch circuit of FIG. 3 comprises only the MOS transistors but may comprise bipolar transistors, like the first preferred embodiment. Specifically, the PMOS transistors 3, 4 are replaced with pnp bipolar transistors and the NMOS transistors 31 to 34, 35, 36 be replaced with npn bipolar transistors, with the source, drain and gate terminals associated respectively with emitter, collector and base terminals. The outputs of the switch circuits 37 to 40 are connected to the base terminals of the corresponding npn bipolar transistors. The switch circuit is of any construction which selects and outputs a signal for controlling the conduction and non-conduction of the transistors.

Fourth Preferred Embodiment

Figure 5:
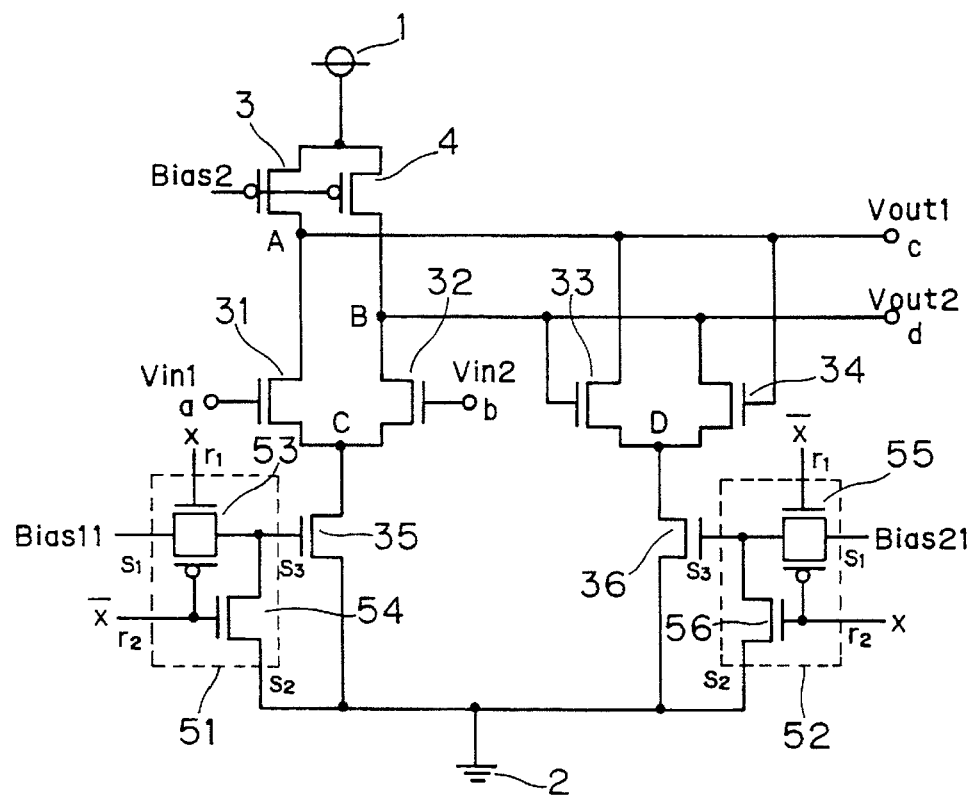
FIG. 5 is a circuit diagram of the differential latch circuit according to a fourth preferred embodiment of the present invention.

FIG. 5 is a circuit diagram of the differential latch circuit according to a fourth preferred embodiment of the present invention. In FIG. 5, the reference numeral 51 designates a switch circuit including a transmission gate 53 and an NMOS transistor 54 operating in the linear region; and 52 designates a switch circuit including a transmission gate 55 and an NMOS transistor 56 operating in the linear region. The switch circuits 51 and 52 are identical in construction and switching operation with the switch circuits of FIG. 3 and have s1, s2, s3, r1, r2 terminals.

The switch circuit 51 has the s1 terminal receiving a bias voltage Bias11, the s2 terminal connected to the Vss 2, the s3 terminal connected to the gate electrode of the NMOS transistor 35, the r1 terminal receiving the digital signal X, and the r2 terminal receiving the digital signal $\overline{X}$. The switch circuit 52 has the s1 terminal receiving a bias voltage Bias21, the s2 terminal connected to the Vss 2, the s3 terminal connected to the gate electrode of the NMOS transistor 36, the r1 terminal receiving the digital signal $\overline{X}$, and the r2 terminal receiving the digital signal X.

The input terminals a and b are directly connected to the gate electrodes of the NMOS transistors 31 and 32, respectively. The gate electrodes of the NMOS transistors 33 and 34 are directly connected to the node B and A, respectively. The bias voltages Bias11 and Bias21 are generally the same and applied to the gate electrodes of the NMOS transistors 35 and 36 to operate the NMOS transistors 35 and 36 as constant current sources in the saturation region, respectively.

Other reference numerals and characters of FIG. 5 designate parts identical with or corresponding to those of FIG. 3.

The operation of the differential latch circuit of FIG. 5 is described below. Like the above stated preferred embodiments, the analog signal voltages are applied to the input terminals a and b.

(1) X=H and $\overline{X}$=L (through mode)

The bias voltage Bias11 applied to the s1 terminal of the switch circuit 51 is outputted from the s3 terminal thereof and then applied to the gate electrode of the NMOS transistor 35. The NMOS transistor 35 serves as the constant current source operating in the saturation region, and forms a differential amplifier with the PMOS transistors 3, 4 and NMOS transistors 31, 32. The differential amplifier provides the potentials Vout1 and Vout2 having a potential difference based on the potential difference between the analog signal potentials Vin1 and Vin2. The potential (0 V) of the Vss 2 applied to the s2 terminal of the switch circuit 52 is outputted from the s3 terminal thereof and then applied to the gate electrode of the NMOS transistor 36. Then the NMOS transistor 36 turns off, and the NMOS transistors 33, 34 do not act as the latch circuit.

The arrangement of FIG. 5 comprises the latch circuit consisting of the NMOS transistors 33 and 34, and the switch circuit 52. However, the present invention is not limited to such an arrangement. The latch circuit is required only to receive the signals at the nodes A and B to generate two complementary logic signals from the signal voltages. The switch circuit is required, in the through mode, only to output the signals at the nodes A and B intactly from the output terminals c and d and, in the latch mode, only to place the latch circuit into the latch operation to produce two complementary logic signals from the signals at the nodes A and B to output the logic signals from the output terminals c and d. Such latch and switch circuits provide the above stated effects. For example, the circuit arrangement of the NMOS transistors 33, 34, 36 and switch circuits 39, 40 of FIG. 3 may be employed.

(2) X=L and $\overline{X}$=H (latch mode)

The potential (0 V) of the Vss 2 applied to the s2 terminal of the switch circuit 51 is outputted from the s3 terminal thereof and then applied to the gate electrode of the NMOS transistor 35. Then the NMOS transistor 35 turns off and does not perform the differential amplification on the potential difference between the analog signal potentials Vin1 and Vin2. The bias voltage Bias21 applied to the s1 terminal of the switch circuit 52 is outputted from the s3 terminal thereof and then applied to the gate electrode of the NMOS transistor 36. The NMOS transistor 36 acts as the constant current source operating in the saturation region. The nodes A, B are electrically connected to the Vss 2 through the node D, and the NMOS transistors 33 and 34 form a latch circuit. The output terminals c and d determine the logic level from the output potentials Vout1 and Vout2 at the transition from the through mode to the latch mode to output complementary digital signals by the operation similar to that of the above mentioned preferred embodiments.

Like the second preferred embodiment, (1) the NMOS transistor 35 operates without the loss of the constant current source function of the differential amplifier circuit in the through mode, and (2) the input signal voltage has a wider range than that of the first and second preferred embodiments.

The circuit of the fourth preferred embodiment includes only three MOS transistors in the circuit path extending from the Vdd 1 through the node C to the Vss 2, performing correct differential amplification in the through mode at a lower power supply voltage than the conventional circuit (FIG. 10) including the four MOS transistors therein. This lowers the power consumption of the circuit, like the third preferred embodiment.

The circuit of FIG. 5 requires the two switch circuits 51, 52 whereas the circuit of FIG. 3 requires the four switch circuits, thereby reducing the circuit area when formed in one chip.

Figure 6:
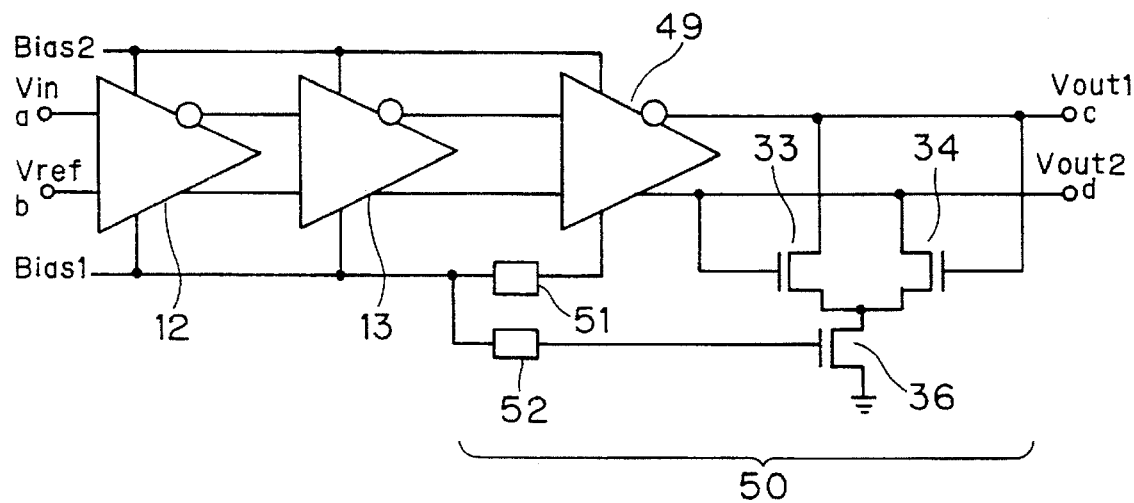
FIG. 6 is a circuit diagram of the voltage comparator employing the differential latch circuit of FIG. 5.

FIG. 6 is a circuit diagram of a voltage comparator employing the differential latch circuit of the fourth preferred embodiment. Like the arrangement of FIG. 4, each of the differential amplifier 13 and the differential amplifier circuit portion of the differential latch circuit comprises three MOS transistors connected in series to provide good matching property between the differential amplifier 13 and the differential latch circuit, achieving the voltage comparator having good amplification gain. The bias voltages Bias01, Bias02 for use in the differential amplifiers 12, 13 and the bias voltages Bias11, Bias21, Bias2 for use in the differential latch circuit of FIG. 5 may be common and the same.

Figure 12:
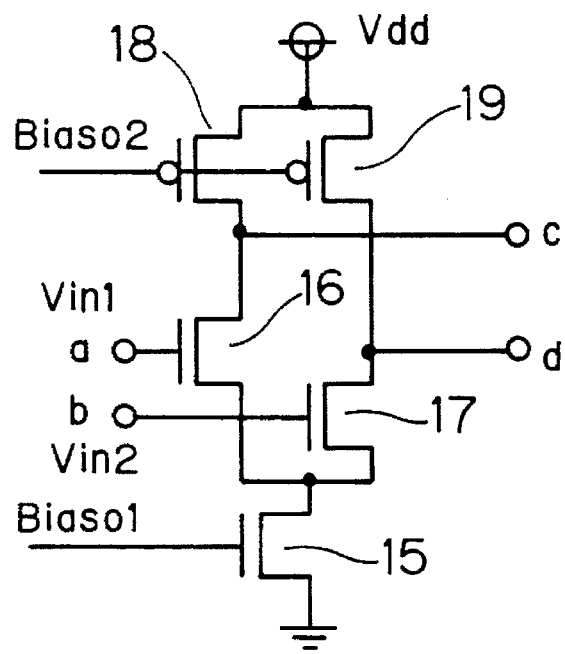
FIG. 12 is a circuit diagram of a differential amplifier circuit used in FIG. 11.

In the voltage comparator of FIG. 6, the differential latch circuit includes the switch circuits 51, 52 and NMOS transistors 33, 34, 36 in addition to the conventional differential amplifier of FIG. 12, simplifying the circuit design and requiring less time and labor therefor.

The s2 terminals of the switch circuits 51, 52 are connected to the Vss 2 in the fourth preferred embodiment, but the present invention is not limited thereto. The same operation is performed if the s2 terminals receive a voltage which does not operate the NMOS transistors 35, 36. It is not particularly necessary to apply the same voltage to the s2 terminals of the switch circuits 51, 52, but voltages to be applied thereto are required to turn off the NMOS transistors 35, 36.

The arrangement of the switch circuits 51, 52 is not limited to that of FIG. 5 but may be constructed to form a selecting circuit for selectively outputting one of the signals applied to the s1 and s2 terminals from the s3 terminal in response to the complementary digital signals X and $\overline{X}$.

In the differential latch circuit, the Vdd (power supply) and Vss (ground) may be interchanged, and the NMOS transistors and PMOS transistors may be interchanged.

The differential latch circuit of FIG. 5 comprises only the MOS transistors but may comprise bipolar transistors, like the first preferred embodiment. Specifically, the PMOS transistors 3, 4 are replaced with pnp bipolar transistors and the NMOS transistors 31 to 34, 35, 36 be replaced with npn bipolar transistors, with the source, drain and gate terminals associated respectively with emitter, collector and base terminals. The outputs of the switch circuits 51, 52 are connected to the base terminals of the corresponding npn bipolar transistors. The switch circuit is of any construction which selects and outputs a signal for controlling the conduction and non-conduction of the transistors.

Fifth Preferred Embodiment

Figure 7:
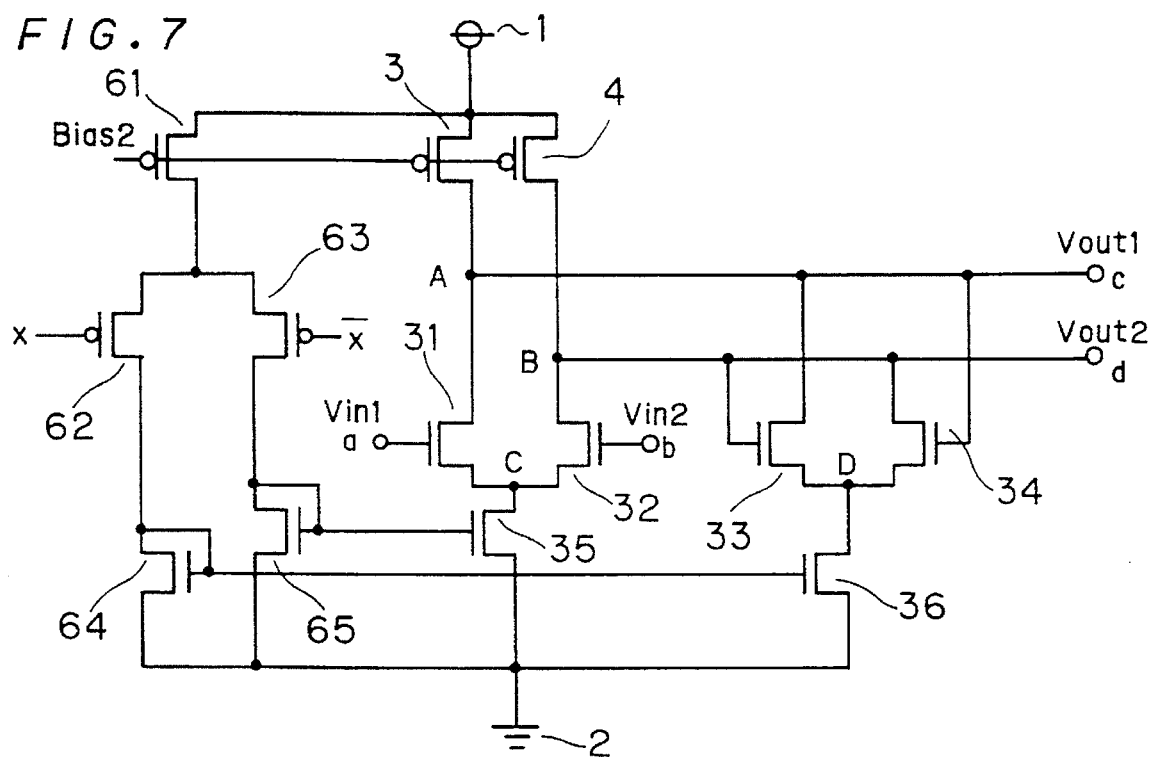
FIG. 7 is a circuit diagram of the differential latch circuit according to a fifth preferred embodiment of the present invention.

FIG. 7 shows a modification of the differential latch circuit of the fourth preferred embodiment.

In FIG. 7, the reference numeral 61 designates a PMOS transistor having a source terminal connected to the Vdd 1 and serving as a constant current source; 62 and 63 designate PMOS transistors having source terminals commonly connected to the drain terminal of the PMOS transistor 61; 64 designates an NMOS transistor having a drain terminal connected to the drain terminal of the PMOS transistor 62 and a source terminal connected to the VSS 2: and 65 designates an NMOS transistor having a drain terminal connected to the drain terminal of the PMOS transistor 63 and a source terminal connected to the Vss 2.

The gate electrode and drain terminal of the NMOS transistor 64 are connected, and the connection node therebetween is connected to the gate electrode of the NMOS transistor 36. The NMOS transistors 64, 36 form a current mirror circuit, with the drain current of the NMOS transistor 64 equal in amount to the drain current of the NMOS transistor 36. Likewise, the gate electrode and drain terminal of the NMOS transistor 65 are connected, and the connection node therebetween is connected to the gate electrode of the NMOS transistor 35. The NMOS transistors 65, 35 form a current mirror circuit, with the drain current of the NMOS transistor 65 equal in amount to the drain current of the NMOS transistor 35.

The reference characters X and $\overline{X}$ designate complementary digital signals applied to the gate electrodes of the PMOS transistors 62, 63, respectively, for controlling the switching between the through mode and the latch mode in the differential latch circuit. The signals X and $\overline{X}$ allow the PMOS transistors 62, 63 to operate as switch circuits in the linear region when conducting.

The bias voltage Bias2 of the PMOS transistors 3 and 4 is commonly used as the bias voltage of the PMOS transistor 61.

Other reference numerals and characters of FIG. 7 designate parts identical with or corresponding to those of FIG. 5.

The operation of the differential latch circuit of FIG. 7 is described below. Like the above stated preferred embodiments, the analog signal voltages are applied to the input terminals a and b.

(1) X=H and $\overline{X}$=L (through mode)

The PMOS transistor 62 is OFF and the PMOS transistor 63 is ON. The entire constant current generated by the PMOS transistor 61 flows between the drain and source of the NMOS transistor 65 through the PMOS transistor 63. This current is equal in amount to the drain current of the NMOS transistor 35 forming the current mirror circuit. The NMOS transistor 35 serves as a constant current source and forms a differential amplifier with the PMOS transistors 3, 4 and NMOS transistors 31, 32. The differential amplifier provides the output potentials Vout1 and Vout2 having a potential difference based on the potential difference between the analog signal potentials Vin1 and Vin2.

Since there is no current flow between the drain and source of the NMOS transistor 64, the drain current of the NMOS transistor 36 is zero. Therefore, the nodes A, B are not electrically connected to the Vss 2 through the node D. The NMOS transistors 33, 34 do not act as the latch circuit.

(2) X=L and $\overline{X}$=H (latch mode)

The PMOS transistor 62 is ON and the PMOS transistor 63 is OFF. The entire constant current generated by the PMOS transistor 61 flows between the drain and source of the NMOS transistor 64 through the PMOS transistor 62. This current is equal in amount to the drain current of the NMOS transistor 36 forming the current mirror circuit. The NMOS transistor 36 serves as a constant current source. The nodes A, B are electrically connected to the Vss 2 through the node D, and the NMOS transistors 33, 34 perform the latch operation. Therefore, the output terminals c and d determine the signal level "H" or "L" from the output potentials at the instant of the transition to the latch mode to output the complementary digital signals by the operation similar to that of the above described preferred embodiments.

Since there is no current flow between the drain and source of the NMOS transistor 65, the drain current of the NMOS transistor 35 is zero. Thus the NMOS transistor 35 is OFF and does not perform the differential amplification on the potential difference between the analog signal potentials Vin1 and Vin2.

For the circuit of the fifth preferred embodiment, there is no need to use the bias voltages Bias11 and Bias21 applied to the gate electrodes of the NMOS transistors 35, 36 of FIG. 5. Instead, the transistor characteristics of the NMOS transistors 64, 65 and PMOS transistor 61 must be determined so that a predetermined constant current is generated in the NMOS transistors 35, 36.

The differential latch circuit of the fifth preferred embodiment provides the same effects as the fourth preferred embodiment.

In the differential latch circuit, the Vdd (power supply) and Vss (ground) may be interchanged, and the NMOS transistors and PMOS transistors may be interchanged.

The differential latch circuit of FIG. 7 comprises only the MOS transistors but may comprise bipolar transistors. Specifically, the PMOS transistors are replaced with pnp bipolar transistors and the NMOS transistors be replaced with npn bipolar transistors, with the source, drain and gate terminals associated respectively with emitter, collector and base terminals.

Sixth Preferred Embodiment

Figure 8:
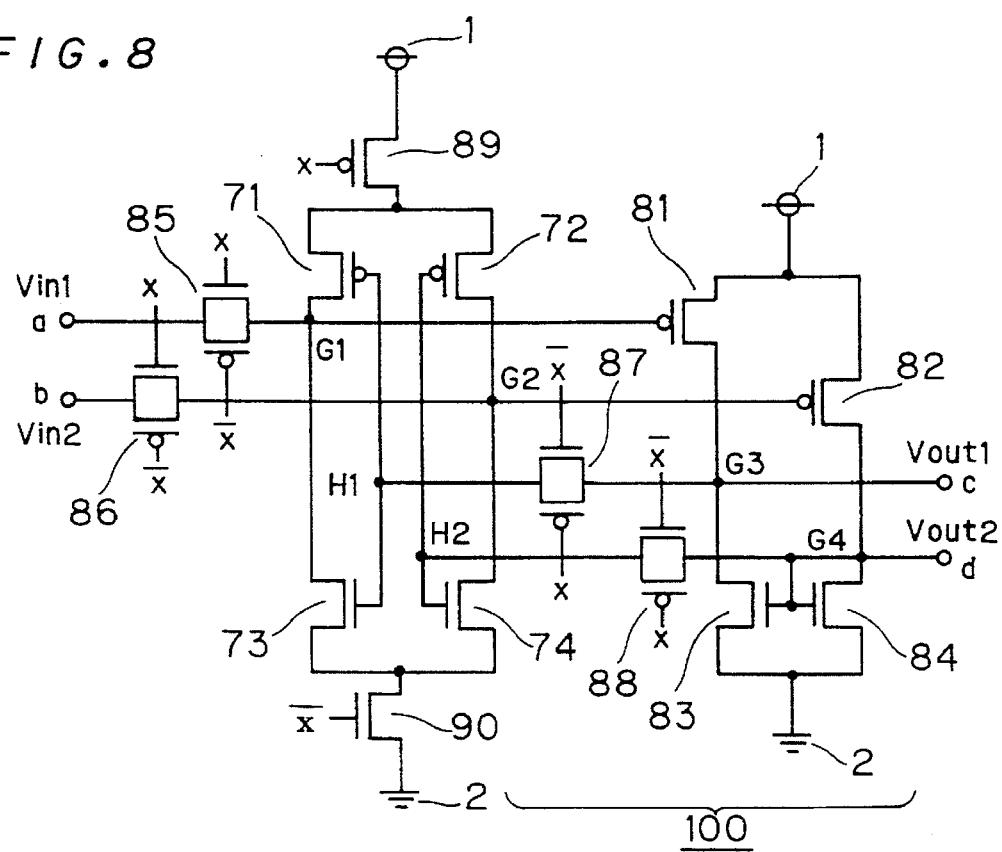
FIG. 8 is a circuit diagram of the differential latch circuit according to a sixth preferred embodiment of the present invention; pod

FIG. 8 is a circuit diagram of the differential latch circuit according to a sixth preferred embodiment of the present invention. In FIG. 8, the reference numerals 81, 82 designate PMOS transistors having source terminals connected to the Vdd 1; 83 designates an NMOS transistor having a drain terminal connected to the drain terminal of the PMOS transistor 81 and a source terminal connected to the Vss 2; and 84 designates an NMOS transistor having a drain terminal connected to the drain terminal of the PMOS transistor 82 and a source terminal connected to the Vss 2. The reference character G3 designates a node connecting the PMOS transistor 81 and NMOS transistor 83; and G4 designates a node connecting the PMOS transistor 82 and NMOS transistor 84. The gate electrodes of the PMOS transistors 81 and 82 are connected to nodes G1 and G2, respectively. The gate electrodes of the NMOS transistors 83 and 84 are commonly connected to the node G4.

The reference numeral 85 designates a transmission gate connected between the input terminal a and the node G1 and having a switch function; 86 designates a transmission gate connected between the input terminal b and the node G2 and having a switch function; 87 designates a transmission gate connected between the node G3 and a node H1 and having a switch function; 88 designates a transmission gate connected between the node G4 and a node H2 and having a switch function; 89 designates a PMOS transistor connected between the Vdd 1 and PMOS transistors 71, 72 and having a switch function; and 90 designates an NMOS transistor connected between the Vss 2 and NMOS transistors 73, 74 and having a switch function. The output terminals c and d are connected respectively to the nodes G3 and G4.

The signals X and $\overline{X}$ are complementary digital signals for controlling the switching between the through mode and latch mode of the differential latch circuit. The signal X is applied to the gate electrodes of NMOS transistors forming the transmission gates 85, 86, the gate electrodes of PMOS transistors forming the transmission gates 87, 88, and the gate electrode of the PMOS transistor 89. The signal $\overline{X}$ is applied to the gate electrodes of PMOS transistors forming the transmission gates 85, 86, the gate electrodes of NMOS transistors forming the transmission gates 87, 88, and the gate electrode of the NMOS transistor 90. The PMOS transistor 89 and NMOS transistor 90 operate in the linear region when they are ON.

Figure 13:
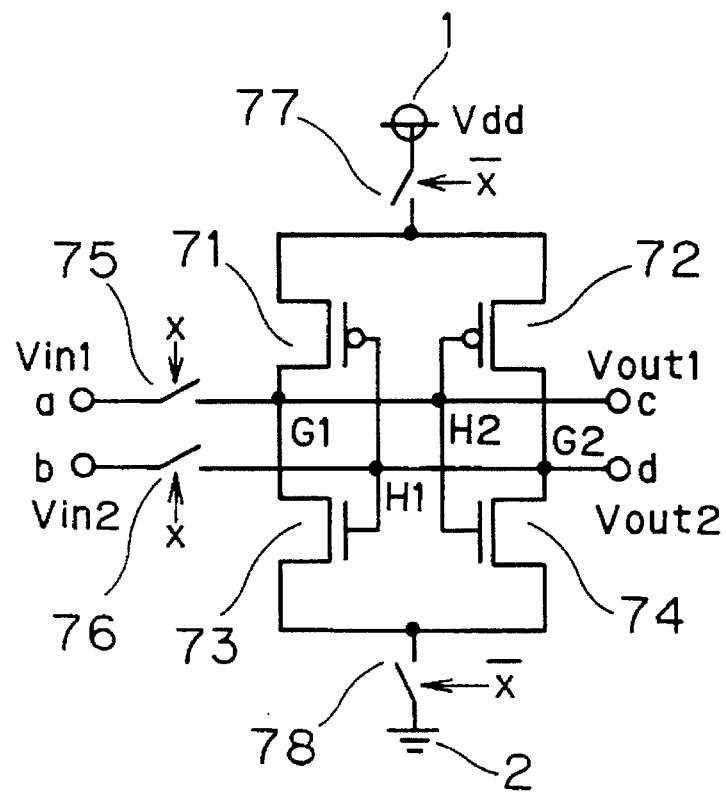
FIG. 13 is a circuit diagram of another conventional differential latch circuit.

Other reference numerals and characters of FIG. 8 designate parts identical with or corresponding to those of FIG. 13.

Figure 9:
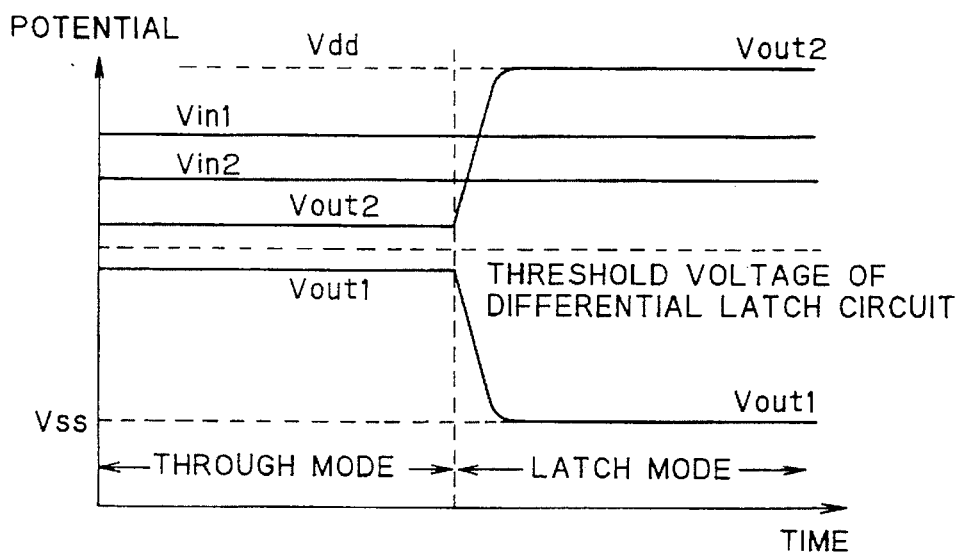
FIG. 9 is a timing chart showing output signal potentials versus time in the differential latch circuit of FIG. 8.

The operation of the differential latch circuit of FIG. 8 is described below with reference to the timing chart of FIG. 9. FIG. 9 shows variations in output potentials Vout1 and Vout2 versus time.

It is assumed that the input terminals a and b receive the constant potentials Vin1 and Vin2 (Vin1>Vin2) which are greater than the threshold voltage of the differential latch circuit.

(1) X=H and $\overline{X}$=L (through mode)

The transmission gates 85, 86 are ON, and the transmission gates 87, 88, PMOS transistor 89, and NMOS transistor 90 are OFF. The input potential Vin1 is applied to the gate electrode of the PMOS transistor 81, and the input potential Vin2 is applied to the gate electrode of the PMOS transistor 82. The PMOS transistors 81, 82 generate constant currents in response to the voltages applied to the gate electrodes thereof, respectively. The current generated in the PMOS transistor 82 is greater than the current generated in the PMOS transistor 81 since Vin1>Vin2. The NMOS transistor 84 has a drain terminal and a gate electrode connected together, that is, a diode arrangement to serve as a conventional resistor. Thus the output potential Vout2 at the output terminal d is determined by the resistance of the NMOS transistor 84 and the current generated in the PMOS transistor 82. On the other hand, the output potential Vout1 is lower than the output potential Vout2 since the output potential Vout2 is applied to the gate electrode of the NMOS transistor 83 and the current generated in the PMOS transistor 81 is smaller than the current generated in the PMOS transistor 82. As shown in FIG. 9, the output signals indicate Vout1<Vout2 in response to the input signals which satisfy Vin1>Vin2 in the through mode.

The PMOS transistor 71 and NMOS transistor 73 form a first inverter circuit, and the PMOS transistor 72 and NMOS transistor 74 form a second inverter circuit. The first and second inverter circuits have a threshold value (Vdd−Vss)/2 which in turn is the threshold value of the differential latch circuit of FIG. 9.

A circuit consisting of the PMOS transistors 81, 82 and NMOS transistors 83, 84 serves as a differential amplifier for providing the output signal potentials Vout1 and Vout2 which satisfy Vout1<threshold value<Vout2 in response to the input signal potentials Vin1 and Vin2. This relation Vout1<threshold value<Vout2 is obtained by controlling predetermined characteristics of the PMOS transistors 81, 82 and NMOS transistors 83, 84. For example, the gate length and gate width of the transistors are made to have predetermined sizes in response to the input signal potentials Vin1 and Vin2.

The Vdd 1 is not connected to the PMOS transistors 71, 72, and the Vss 2 is not connected to the NMOS transistors 73, 74. Thus the PMOS transistors 71, 72 and NMOS transistors 73,74 do not act in response to the input signal potentials Vin1 and Vin2.

(2) X=L and $\overline{X}$=H (latch mode)

The transmission gates 85, 86 are OFF, and the transmission gates 87, 88, PMOS transistor 89, and NMOS transistor 90 are ON. The output potentials Vout1 and Vout2 determined at the instant of the transition from the through mode to the latch mode are applied to the nodes H1 and H2, respectively. The Vdd 1 is connected to the PMOS transistors 71, 72, and the Vss 2 is connected to the NMOS transistors 73, 74. Thus The PMOS transistor 71 and NMOS transistor 73 act as the first inverter circuit receiving the output potential Vout1, and the PMOS transistor 72 and NMOS transistor 74 act as the second inverter circuit receiving the output potential Vout2.

Using the output potentials at the transition from the through mode to the latch mode as initial values, the inverter action of the PMOS transistor 71 and NMOS transistor 73 and the inverter action of the PMOS transistor 72 and NMOS transistor 74 determine the potentials at the nodes G1 and G2.

At the start of the latch mode, the output potential Vout2 is higher than the threshold value of the differential latch circuit and the output potential Vout1 is lower than the threshold value thereof. Thus the potential at the node G1 increases and the potential at the node G2 decreases. The potentials at the nodes G1 and G2 are applied to the gate electrodes of the PMOS transistors 81 and 82, respectively. The PMOS transistors 81, 82 and NMOS transistors 83, 84 act as the differential amplifier receiving the inputs from the nodes G1 and G2 as above noted. As the potential at the node G1 increases and the potential at the node G2 decreases, the output potential Vout1 decreases and the output potential Vout2 increases. Simultaneous application of the output potentials Vout1 and Vout2 to the nodes H1 and H2 accelerates the decrease in output potential Vout1 and increase in output potential Vout2. After the transition from the through mode to the latch mode, the decrease in output potential Vout1 and the increase in output potential Vout2 are accelerated as shown in FIG. 9.

Since the node G2 substantially reaches the potential of the Vss 2, electrical connection between the drain and source of the PMOS transistor 82 is substantially made, and the output potential Vout2 reaches the potential of the Vdd 1 and is determined at "H". On the other hand, since the node G1 substantially reaches the potential of the Vdd 1, electrical connection between the drain and source of the PMOS transistor 81 is not made but electrical connection between the drain and source of the NMOS transistor 83 is made. Then the output potential Vout1 reaches the potential of the Vss 2 and is determined at "L", and the output potential Vout2 reaches the potential of the Vdd 1 and is determined at "H". At this time, the NMOS transistors 83, 84 act as the active load resistors of the differential amplifier to prevent both of the output potentials Vout1 and Vout2 from becoming "H" or "L".

In this manner, one of the input signal potentials Vin1 and Vin2 is converted to the potential higher than the threshold voltage of the differential latch circuit and the other potential is converted to the potential lower than the threshold voltage thereof in the through mode. The resultant potentials are used as the initial voltages at the start of the latch mode. The difference between the DC operating point level of the differential latch circuit in response to the input potentials Vin1 and Vin2 and the threshold voltage of the differential latch circuit (e.g., deviation of the output potentials Vout1 and Vout2 in the through mode shown in FIG. 14 from the threshold voltage) can alleviate the conflict of the output voltages which occurs after the transition to the latch mode, determining the output signal levels "H" or "L" at high speeds. Therefore, the digital circuit at the next stage which is connected to the output terminals of the differential latch circuit can perform the signal processing at high speeds.

The signals applied to the differential latch circuit of FIG. 8 are the two analog signals differentially amplified and outputted from the differential amplifier 13 at the last stage of the plurality of differential amplifiers connected as shown in FIG. 11. The signals are DC voltages having a constant potential in this preferred embodiment. In general, the signals applied in practice are, however, analog signals having amplitudes slightly oscillating about a central potential which is determined by the circuit characteristics in use. The size of the PMOS transistors 81, 82 and NMOS transistors 83, 84 forming the differential amplifier circuit is controlled so that the central potential is substantially converted to the threshold voltage of the differential latch circuit. The signal potentials Vin1 and Vin2 outputted in the through mode vary adjacent the threshold value, permitting the "H"or "L" level determination of the output signals at high speeds in the latch mode.

In general, the threshold voltage of an input signal which determines the output logic level in a digital circuit is (Vdd−Vss)/2 which often coincides with the threshold value of the differential latch circuit. The digital circuit at the next stage of the differential latch circuit can recognize and process the output potentials Vout1 and Vout2 as "L" and "H" levels, respectively, at the instant of the transition from the through mode to the latch mode in FIG. 9, thereby allowing fast processing time.

The differential latch circuit of this preferred embodiment, which comprises the circuit designated by the reference numeral 100 in addition to the arrangement of FIG. 13, may independently control the conversion of the output signals from the differential latch circuit in the through mode to the voltages adjacent the threshold voltage by the added circuit 100, facilitating the circuit design.

The present invention is not limited to the circuit arrangement of FIG. 8, but the differential amplifier circuit 100 is required to receive and differentially amplify the signals at the nodes G1 and G2 to output the amplified signals from the output terminals c and d, with the signals at the output terminals c and d applied to the nodes H1 and H2 through the transmission gates 87 and 88, respectively. However, the characteristics of the differential amplifier circuit must be controlled so that the two signal voltages outputted in the through mode are level-shifted to the threshold voltage of the differential latch circuit as above noted.

The differential latch circuit provides similar operation and effects when the Vdd 1 and Vss 2 are interchanged and the NMOS transistors and PMOS transistors are interchanged.

While the invention has been described in detail, the foregoing description is in all aspects illustrative and not restrictive. It is understood that numerous other modifications and variations can be devised without departing from the scope of the invention.

We claim:

1. A differential latch circuit comprising:
   a first load resistor having a first terminal coupled to a first power supply terminal, and a second terminal coupled to a first node;
   a second load resistor having a first terminal coupled to said first power supply terminal, and a second terminal coupled to a second node;
   a first transistor having a first electrode, a second electrode, and a control electrode coupled to a first input terminal;
   a second transistor having a first electrode, a second electrode, and a control electrode coupled to a second input terminal;
   a constant current source having a first terminal directly connected to the second electrodes of said first and second transistors, and a second terminal directly connected to a second power supply terminal;
   a latch circuit receiving signals from said first and second nodes for generating two complementary logic signals from the voltages of the received signals to output the two complementary logic signals from first and second output terminals;
   a first switch circuit for simultaneously controlling current conduction and non-conduction between said first node and said first transistor and between said second node and said second transistor; and
   a second switch circuit for operating the latch circuit in a through mode in which signals at said first and second nodes amplified by said first and second transistors are output from said first and second output terminals, respectively, when said first switch circuit is in a current conduction mode and for operating said latch circuit in a latch mode to latch signals existing at said first and second modes when said first switch circuit is in a current non-conduction mode.

2. The differential latch circuit of claim 1,
   wherein said latch circuit comprises:
      a third transistor having a first electrode coupled to said first node, a second electrode coupled to said second power supply terminal, and a control electrode coupled to said second node; and
      a fourth transistor having a first electrode coupled to said second node, a second electrode coupled to said second power supply terminal, and a control electrode coupled to said first node, and
   wherein said first switch circuit comprises:
      a fifth transistor coupled between said first node and the first electrode of said first transistor; and
      a sixth transistor coupled between said second node and the first electrode of said second transistor.

3. The differential latch circuit of claim 2, wherein said second switch circuit comprises:

a seventh transistor directly connected between the second electrode of said third transistor and said second power supply terminal and between the second electrode of said fourth transistor and said second power supply terminal.

4. The differential latch circuit of claim 3, wherein said first to seventh transistors are MOS transistors.

5. A differential latch circuit comprising:

a first load resistor coupled between a first power supply terminal and a first node, said first node being coupled to a first output terminal;

a second load resistor coupled between said first power supply terminal and a second node, said second node being coupled to a second output terminal;

a first transistor having a first electrode coupled to said first node, a second electrode, and a control electrode coupled to a first input terminal;

a second transistor having a first electrode coupled to said second node, a second electrode, and a control electrode coupled to a second input terminal;

a third transistor having a first electrode coupled to said first node, a second electrode coupled to a second power supply terminal, and a control electrode coupled to said second node;

a fourth transistor having a first electrode coupled to said second node, a second electrode coupled to said second power supply terminal, and a control electrode coupled to said first node;

a constant current source having a first terminal directly connected to the second electrodes of said first and second transistors, and a second terminal directly connected to said second power supply terminal;

a first switch circuit for simultaneously controlling current conduction and non-conduction between said first node and the first electrode of said first transistor and between said second node and said second transistor; and a second switch circuit operating in complementary relation to said first switch circuit for simultaneously controlling current conduction and non-conduction between said first node and said third transistor and between said second node and said fourth transistor.

6. A differential latch circuit comprising:

a first load resistor coupled between a first power supply terminal and a first node, said first node being coupled to a first output terminal;

a second load resistor coupled between said first power supply terminal and a second node, said second node being coupled to second output terminal;

a first MOS transistor having a first electrode coupled to said first node, a second electrode, and a gate electrode coupled to a first input terminal;

a second MOS transistor having a first electrode coupled to said second node, a second electrode, and a gate electrode coupled to a second input terminal;

a third MOS transistor having a first electrode coupled to said first node, a second electrode coupled to a second power supply terminal, and a gate electrode coupled to said second node;

a fourth MOS transistor having, a first electrode coupled to said second node, a second electrode coupled to said second power supply terminal, and a gate electrode coupled to said first node;

a fifth MOS transistor having a first electrode directly connected to the second electrodes of said first and second MOS transistors, a second electrode directly connected to said second power supply terminal, and a gate electrode;

a first switch circuit for simultaneously controlling current conduction and non-conduction between said first node and said first MOS transistor and between said second node and said second MOS transistor; and a second switch circuit operating in complementary relation to said first switch circuit for simultaneously controlling current conduction and non-conduction between said first node and said third MOS transistor and between said second node and said fourth MOS transistor.

7. The differential latch circuit of claim 6, wherein said first switch circuit comprises:

a sixth MOS transistor coupled between said first node and the first electrode of said first MOS transistor; and, a seventh MOS transistor coupled between said second node and said second MOS transistor.

8. The differential latch circuit of claim 7, wherein the first electrode of said fifth MOS transistor is directly connected to the second electrodes of said third and fourth MOS transistors, and wherein said second switch circuit comprises:

an eighth MOS transistor coupled between said first node and the first electrode of said third MOS transistor; and a ninth MOS transistor coupled between said second node and the first electrode of said fourth MOS transistor.

9. The differential latch circuit of claim 6, wherein said first switch circuit comprises:

first selecting means for selecting one of an input signal applied to said first input terminal and a signal having a potential for forcing said first MOS transistor into non-conduction to apply the selected signal to the gate electrode of said first MOS transistor; and second selecting means for selecting one of an input signal applied to said second input terminal and a signal having a potential for forcing said second MOS transistor into non-conduction to apply the selected signal to the gate electrode of said second MOS transistor.

10. The differential latch circuit of claim 9, wherein said second switch circuit comprises:

third selecting means for selecting one of a signal having a potential at said second node and a signal having a potential for forcing said third MOS transistor into non-conduction to apply the selected signal to the gate electrode of said third MOS transistor; and fourth selecting means for selecting one of a signal having a potential at said first node and a signal having a potential for forcing said fourth MOS transistor into non-conduction to apply the selected signal to the gate electrode of said fourth MOS transistor.

11. The differential latch circuit of claim 6, wherein said first switch circuit comprises selecting means for selecting one of a signal having a potential for forcing said fifth MOS transistor into conduction and a signal having a potential for forcing said fifth MOS transistor into non-conduction to apply the selected signal to the gate electrode of said fifth MOS transistor.

12. The differential latch circuit of claim 11, further comprising:

a sixth MOS transistor having a first electrode directly connected to the second electrodes of said third and fourth MOS transistors, a second electrode directly connected to said second power supply terminal, and a gate electrode, wherein said second switch circuit includes second selecting means for selecting one of a signal having a potential for forcing said sixth MOS transistor into conduction and a signal having a potential for forcing said sixth MOS transistor into non-conduction to apply the selected signal to the gate electrode of said sixth MOS transistor.

13. The differential latch circuit of claim 12, wherein said first selecting means includes a seventh MOS transistor for forming a current mirror circuit with said fifth MOS transistor, wherein said second selecting means includes an eighth MOS transistor for forming a current mirror circuit with said sixth MOS transistor, said seventh MOS transistor and said eighth MOS transistor being forced into conduction and non-conduction in complementary relation.

14. A differential latch circuit comprising:

a differential amplifier circuit receiving a first input signal and a second input signal for differentially amplifying said first and second input signals to output the amplified signals from first and second output terminals, respectively;

a first inverter circuit receiving the signal outputted from said first output terminal;

a second inverter circuit receiving the signal outputted from said second output terminal;

a first switch circuit for selecting a signal applied to a first input terminal or an output signal from said first inverter circuit to provide said first input signal; and a second switch circuit for selecting a signal applied to a second input terminal or an output signal from said second inverter circuit to provide said second input signal, wherein said differential amplifier circuit comprises:

a first MOS transistor having a first electrode coupled to a first power supply terminal, a second electrode, and a gate electrode receiving said first input signal;

a second MOS transistor having a first electrode coupled to said first power supply terminal, a second electrode and a gate electrode receiving said second input signal;

a first load resistor coupled between the second electrode of said first MOS transistor and a second power supply terminal; and a second load resistor coupled between the second electrode of said second MOS transistor and said second power supply terminal, said first output terminal being coupled to a node connecting said first MOS transistor and said first load resistor, said second output terminal being coupled to a node connecting said second MOS transistor and said second load resistor.

* * * * *